(12) United States Patent
Yasuda et al.

(10) Patent No.: US 8,212,472 B2
(45) Date of Patent: Jul. 3, 2012

(54) ORGANIC ELECTRIC FIELD LIGHT-EMITTING ELEMENT

(75) Inventors: Hideki Yasuda, Kanagawa (JP); Tasuku Satoh, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 13/040,392

(22) Filed: Mar. 4, 2011

(65) Prior Publication Data

US 2011/0227478 A1    Sep. 22, 2011

(30) Foreign Application Priority Data

Mar. 17, 2010  (JP) ................................ 2010-061097
Mar. 1, 2011   (JP) ................................ 2011-044166

(51) Int. Cl.
*H05B 33/00* (2006.01)
(52) U.S. Cl. ........................................ 313/504; 428/917
(58) Field of Classification Search .................. None
See application file for complete search history.

(56) References Cited

U.S. PATENT DOCUMENTS 7,839,078 B2 * 11/2010 Nishita et al. ................. 313/504
2009/0026936 A1   1/2009 Satou et al.
2010/0066239 A1 * 3/2010 Spindler et al. ............... 313/504

FOREIGN PATENT DOCUMENTS

JP    2001-189193 A    7/2001
JP    2009-55010 A     3/2009

* cited by examiner

*Primary Examiner* — Ashok Patel
(74) *Attorney, Agent, or Firm* — Birch, Stewart, Kolasch & Birch, LLP

(57) ABSTRACT

An organic electric field light-emitting element, which contains: an anode; a cathode; and a light-emitting layer provided between the anode and the cathode, wherein the light-emitting layer contains two or more luminescent materials each giving a different emission peak, and a concentration ratio [(B/A)×100] in the light-emitting layer gradually increases along with the direction from an anode side of the light-emitting layer to a cathode side of the light-emitting layer, where A denotes a concentration of the luminescent material having the emission peak at the shortest wavelength side compared to the emission peaks of other luminescent materials, and B denote a concentration of the luminescent material having the emission peak at the longest wavelength side compared to the emission peaks of other luminescent materials, and wherein the light-emitting layer satisfies the relationship of: [(B/A)×100]≦10%.

18 Claims, 17 Drawing Sheets

ORGANIC ELECTRIC FIELD LIGHT-EMITTING ELEMENT

BACKGROUND OF THE INVENTION

1. Field of the Invention

The present invention relates to an organic electric field light-emitting element (may also referred to as an "organic electroluminescence element", an "organic EL element", and the like).

2. Description of the Related Art

Organic electric field light-emitting elements have characteristics such as of self luminescence and high-speed response, and hence are expected as applications for flat panel displays. Especially since a two layer (laminate) type of organic electric field light-emitting elements, in which a thin hole-transporting organic film (i.e. a hole transporting layer) and a thin electron-transporting organic film (i.e. an electron transporting layer) are laminated were reported, organic electric field light-emitting elements attracted great deals of interests as large-scale luminescence elements which emits light with low voltage of 10 V or lower. The basic structure of the laminate type of the organic electric field light-emitting element is a laminate structure of a positive electrode, a hole transporting layer, a light emitting layer, an electron transporting layer, and a negative electrode.

Such organic electric field light-emitting element loses its carrier balance when the current density changes, which causes decreased emission efficiency or permanence, and chromaticity changes of emission. Among these problems, the main factor for causing the chromaticity change is an influence from optical interference due to the change of the location where light is emitted. Due to the optical interference, the color of the emission is tinted with blue as the location is closer to the electrode, and is tinted with red as the location is distant from the electrode. This phenomenon is more significantly shown as the light-emitting layer is thicker.

To solve this problem, for example, in Japanese Patent Application Laid-Open (JP-A) No. 2009-55010, the following organic electric field light-emitting element is proposed. This organic electric field light-emitting element contains an organic layer containing a light-emitting layer, disposed between a pair of electrodes. This light-emitting layer contains at least two luminescent materials each having a different value of electron affinity (Ea) or ionization potential (Ip), and at least one host material, where the concentration of the luminescent material having the larger value of Ea or Ip among the two luminescent materials gradually decreases in the light-emitting layer in the direction from the cathode side to the anode side of the light-emitting layer, and the concentration of the luminescent material having the smaller value of Ea or Ip gradually decreases in the direction from the anode side to the cathode side of the light-emitting layer.

Moreover, proposed in JP-A No. 2001-189193 is a light-emitting element having a light-emitting region between an anode and a cathode, in which the light-emitting region is consisted of a material contributing to emission and a medium to include such material, and the light-emitting region has an almost continuously changing concentration distribution of the material contributing to emission in the direction from the anode side to the cathode side of the light-emitting region.

However, the control of the luminescent material concentration disclosed in the patent literatures is aimed to improve emission efficiency and permanence by controlling a carrier balance, and no consideration is paid for preventing chromaticity change caused by current density.

Accordingly, it has been desired to promptly provide an organic electric field light-emitting element, which has improved emission efficiency and permanence as well as capable of preventing a chromaticity change when current density is changed, by changing the concentration of a doping material to prevent the color sift caused by optical interference.

BRIEF SUMMARY OF THE INVENTION

The present invention aims at providing an organic electric field light-emitting element having improved emission efficiency and permanence, as well as preventing a chromaticity change of emission at the time when current density is changed.

The present inventors were conducted diligent studies and researches to achieve the aforementioned object. As a result, it was found that an organic electric field light-emitting element, which has improved emission efficiency and permanence as well as suppressing a change of a spectrum of emission due to optical interference, and preventing a chromaticity change of emission at the time when current density is changed, can be obtained by allowing a light-emitting layer to contain a luminescent material(s) having two different emission spectrums at the different concentration ratio, i.e. two or more types of the luminescent material each having a different emission wavelength to each other, and changing, within the light-emitting layer, a ratio of a concentration A of the luminescent material having the emission peak at the shorter wavelength side to the luminescent material having the emission wavelength at the longer wavelength side, or a ratio of an association of the luminescent material to a monomer of the luminescent material.

The present invention is based upon the insights of the present inventors, and means for solving the problems are as follows:

<1> An organic electric field light-emitting element, containing:
an anode;
a cathode; and
a light-emitting layer provided between the anode and the cathode,
wherein the light-emitting layer contains two or more luminescent materials each giving a different emission peak, and a concentration ratio [(B/A)×100] in the light-emitting layer gradually increases along with the direction from an anode side of the light-emitting layer to a cathode side of the light-emitting layer, where the concentration ratio [(B/A)×100] is a concentration ratio of the luminescent materials, and A denotes a concentration of the luminescent material having the emission peak at the shortest wavelength side compared to the emission peaks of other luminescent materials, and B denote a concentration of the luminescent material having the emission peak at the longest wavelength side compared to the emission peaks of other luminescent materials, and
wherein the light-emitting layer satisfies the relationship of: [(B/A)×100]≦10%.

<2> The organic electric field light-emitting element according to <1>, wherein B is constant and A decreases along with the direction from the anode side to the cathode side.

<3> The organic electric field light-emitting element according to <1>, wherein B increases along with the direction from the anode side to the cathode side, and A is constant.

<4> The organic electric field light-emitting element according to <1>, wherein B increases and A decreases along with the direction from the anode side to the cathode side.

<5> The organic electric field light-emitting element according to any one of <1> to <4>, wherein the light-emitting layer satisfies the relationship of: a/b>1.05, where a denotes B/A at the cathode side of the light-emitting layer, and b denotes B/A at the anode side of the light-emitting layer.
<6> The organic electric field light-emitting element according to any one of <1> to <5>, wherein the light-emitting layer has a thickness of 20 nm or more.
<7> The organic electric field light-emitting element according to any one of <1> to <6>, wherein the cathode is a reflecting electrode, and the anode is a transparent electrode.
<8> The organic electric field light-emitting element according to any one of <1> to <6>, wherein the cathode is a reflecting electrode, and the anode is a translucent electrode.
<9> The organic electric field light-emitting element according to any one of <1> to <8>, wherein the luminescent materials are phosphorescent materials.
<10> An organic electric field light-emitting element, containing:
  an anode;
  a cathode; and
  a light-emitting layer provided between the anode and the cathode,
  wherein the light-emitting layer contains a luminescent material whose monomer and association each give a different emission peak,
  wherein a ratio of a concentration of the association of the luminescent material to a concentration of the monomer of the luminescent material gradually increases along with the direction from an anode side of the light-emitting layer to a cathode side of the light-emitting layer, and
  wherein the light-emitting layer satisfies an intensity ratio [(D/C)×100] of 20% or larger, where C denotes an integral spectrum intensity of the monomer and D denotes an integral spectrum intensity of the association.
<11> The organic electric field light-emitting element according to <10>, wherein the concentration of the association is constant, and the concentration of the monomer decreases along with the direction from the anode side to the cathode side, where the emission peak of the association is present at longer wavelength side compared to the emission peak of the monomer, and the emission peak of the monomer is present at shorter wavelength side compared to the emission peak of the association.
<12> The organic electric field light-emitting element according to <10>, wherein the concentration of the association increases along with the direction from the anode side to the cathode side, and the concentration of the monomer is constant, where the emission peak of the association is present at longer wavelength side compared to the emission peak of the monomer, and the emission peak of the monomer is present at shorter wavelength side compared to the emission peak of the association.
<13> The organic electric field light-emitting element according to <10>, wherein the concentration of the association increases and the concentration of the monomer decreases along with the direction from the anode side to the cathode side, where the emission peak of the association is present at longer wavelength side compared to the emission peak of the monomer, and the emission peak of the monomer is present at shorter wavelength side compared to the emission peak of the association.
<14> The organic electric field light-emitting element according to any one of <10> to <13>, wherein the light-emitting layer satisfies the relationship of: a/b>1.05, where a denotes the ratio of the concentration of the association to the concentration of the monomer at the cathode side of the light-emitting layer, and b denotes the ratio of the concentration of the association to the concentration of the monomer at the anode side of the light-emitting layer, and wherein the emission peak of the association is present at longer wavelength side compared to the emission peak of the monomer, and the emission peak of the monomer is present at shorter wavelength side compared to the emission peak of the association.
<15> The organic electric field light-emitting element according to any one of <10> to <14>, wherein the light-emitting layer has a thickness of 20 nm or more.
<16> The organic electric field light-emitting element according to any one of <10> to <15>, wherein the cathode is a reflecting electrode, and the anode is a transparent electrode.
<17> The organic electric field light-emitting element according to any one of <10> to <15>, wherein the cathode is a reflecting electrode, and the anode is a translucent electrode.
<18> The organic electric field light-emitting element according to any one of <10> to <17>, wherein the luminescent material is a phosphorescent material.

The present invention can solves the problems in the art, and provides an organic electric field light-emitting element having improved emission efficiency and permanence, as well as preventing a chromaticity change of emission at the time when current density is changed.

Figure 1:
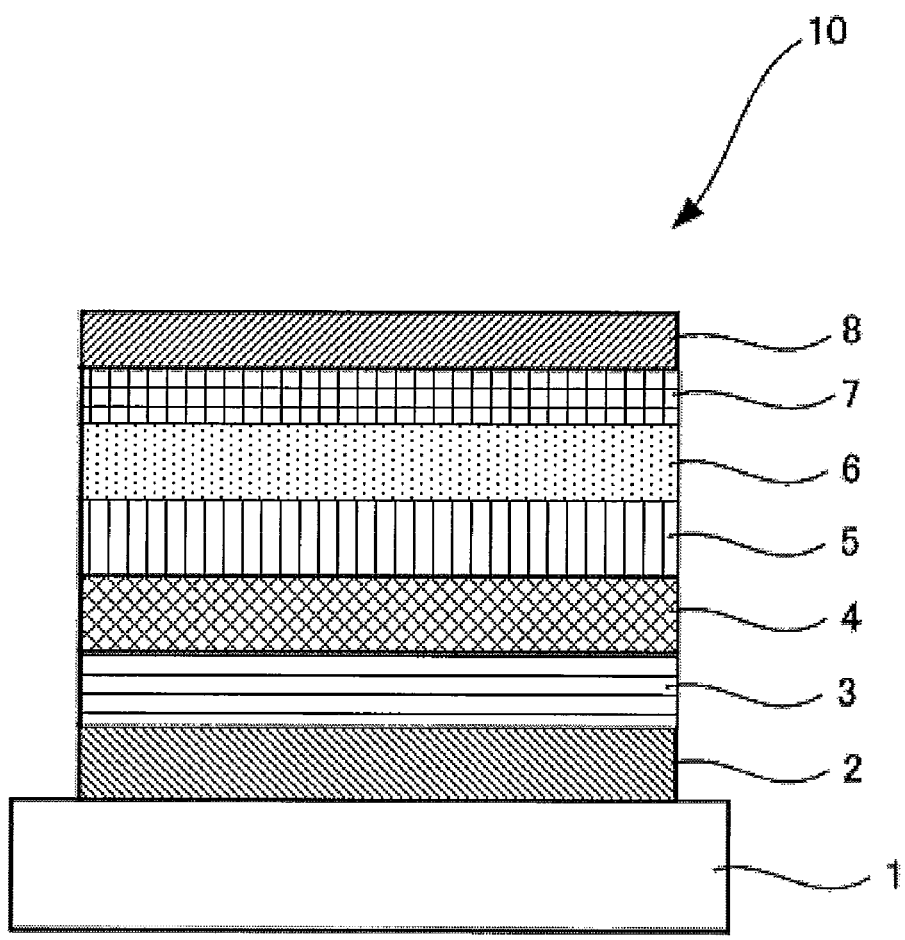
FIG. 1 is a schematic diagram showing one example of the organic electric field light-emitting element of the present invention.

DETAILED DESCRIPTION OF THE INVENTION (Organic Electric Field Light-Emitting Element)

The organic electric field light-emitting element contains at least a light-emitting layer between an anode and a cathode, preferably contains an electron-transporting layer, an electron-injecting layer, a hole-injecting layer, a hole-transporting layer, a hole-blocking layer, and an electron-blocking layer, and may further contain other structural components, if necessary.

In a first embodiment of the organic electric field light-emitting element of the present invention, the light-emitting layer contains two or more luminescent materials each giving a different emission peak, a concentration ratio [(B/A)×100] of a concentration A of the luminescent material having an emission peak at the shortest side among the emission peaks of the luminescent materials to a concentration B of the luminescent material having an emission peak at the longest side among the emission peaks of the luminescent materials gradually increases along with the direction from the anode side to the cathode (reflecting electrode) side, and the concentration ratio [(B/A)×100] is 10% or lower.

The light-emitting layer contains two or more luminescent materials each giving a different emission peak. By changing a concentration ratio of the two or more luminescent materials having different emission spectrums within the light-emitting layer, an emission spectrum change occurred due to optical interference can be prevented.

As the two or more luminescent materials each giving a different emission peak, use of a mixture of luminescent materials of different colors that emit light of white as the mixture is preferable, and use of luminescent materials of three colors, red (R), green (G), and blue (B) is more preferable.

The ratio [(B/A)×100] of the concentration B of the luminescent material having the emission peak at the longest side to the concentration A of the luminescent material having the emission peak at the shortest side gradually increases along with the direction from the anode side to the cathode (reflecting electrode) side of the light-emitting layer. As a result of this, an influence from optical interference is less likely to depend on the position, and the chromaticity change of emission is prevented when the current density is changed.

Examples of the method for gradually increasing the concentration ratio [(B/A)×100] along with the direction from the anode side to the cathode side include a method for changing a deposition speed ratio of each component along with such direction.

The concentration ratio [(B/A)×100] is 10% or lower, preferably 0.1% to 2%. When the concentration ratio [(B/A)×100] is more than 10%, the resulting emission is only derived from the component having the longest emission peak.

Here, the concentration A of the luminescent material having the emission peak at the shortest wavelength side and the concentration B of the luminescent material having the emission wavelength at the longest wavelength side can be measured, for example, by deposition speed of each material relative to the deposition speed of a host material.

It is preferred that the concentration of the luminescent material having the emission peak at the longest wavelength side be constant and the concentration of the luminescent material having emission peak at the shortest wavelength side decreases along with the direction from the anode side to the cathode (reflecting electrode) side of the light-emitting layer, because an influence of optical interference is less likely to depend on the position especially by changing only the concentration of the material having the emission peak at the shortest wavelength side, and a chromaticity change of emission can be prevented when the current density is changed.

It is preferred that the concentration of the luminescent material having the emission peak at the longest wavelength side increase along with the direction from the anode side to the cathode (reflecting electrode) side of the light-emitting layer and the concentration of the luminescent material having the emission peak at the shortest wavelength side be constant, because an influence of optical interference is less likely to depend on the position especially by changing only the concentration of the material having the emission peak at the longest wavelength side, and a chromaticity change of emission can be prevented when the current density is changed.

It is preferred that the concentration of the luminescent material having the emission peak at the longest wavelength side increase and the concentration of the luminescent material having the emission peak at the shortest wavelength side decrease along with the direction from the anode side to the cathode (reflecting electrode) side of the light-emitting layer, because the position dependency of an influence from optical interference can be more accurately reduced, and a chromaticity change of emission can be prevented when the current density is changed.

It is preferred that the light-emitting layer satisfies the relationship of a/b>1.05, where a denotes the concentration ratio [(B/A)×100] at the cathode side of the light-emitting layer and b denotes the concentration ratio [(B/A)×100] at the anode side of the light-emitting layer, because a chromaticity change of emission can be effectively prevented when the current density is changed. The ratio (a/b) is more preferably 1.1 to 2.0.

In a second embodiment of the organic electric field light-emitting element of the present invention, the light-emitting layer contains a luminescent material whose monomer and association each give a different emission peak, a ratio (a concentration of the association/a concentration of the monomer) of a concentration of the association to a concentration of the monomer gradually increases along with the direction from the anode side to the cathode (reflecting electrode) side of the light-emitting layer, and the light-emitting layer satisfies the relationship of [(D/C)×100]≧20%, where [(D/C)×100] is an intensity ratio of the association to the monomer, and C denotes an integral spectrum intensity of the monomer, and D denotes an integral spectrum intensity of the association.

The light-emitting layer contains a luminescent material that exhibits different peak of the emission wavelength between the monomer thereof and the association thereof. By changing the concentration ratio of one luminescent material having different emission spectrums within the light-emitting layer, the emission spectrum change due to optical interference can be prevented.

As such luminescent material, a phosphorescent material which emits light due to molecular association, and emits light of white by itself is preferable.

In the second embodiment, the emission peak of the monomer of the luminescent material is present at the shorter wavelength side compared to the emission peak of the association thereof that is present at the longer wavelength said, because the association is energetically more stable than the monomer.

The ratio (a concentration of the association/a concentration of the monomer) of a concentration of the association to a concentration of the monomer gradually increase along with the direction from the anode side to the cathode (reflecting electrode) side of the light-emitting layer. As a result of this, an influence from optical interference is less likely to depend on the position, and the chromaticity change of emission is prevented when the current density is changed.

Examples of the method for gradually increasing the concentration ratio (the concentration of the association/the concentration of the monomer) along with the direction from the anode side to the cathode side include a method for increasing a deposition speed of the luminescent material relative to the host material along with such direction.

It is preferred that the concentration of the association having the emission is peak at the longer wavelength side be constant and the concentration of the monomer having emission peak at the shorter wavelength side decreases along with the direction from the anode side to the cathode (reflecting electrode) side of the light-emitting layer, because an influence of optical interference is less likely to depend on the position especially by changing only the concentration of the monomer having the emission peak at the shorter wavelength side, and a chromaticity change of emission can be prevented when the current density is changed.

It is preferred that the concentration of the association having the emission peak at the longer wavelength side increase from the direction from the anode side to the cathode (reflecting electrode) side of the light-emitting layer, and the concentration of the monomer having the emission peak at the shorter wavelength side be constant, because an influence of optical interference is less likely to depend on the position especially by changing only the concentration of the association having the emission peak at the longer wavelength side, and a chromaticity change of emission can be prevented when the current density is changed.

It is preferred that the concentration of the association having the emission peak at the longer wavelength side increase and the concentration of the monomer having the emission peak at the shorter wavelength side decrease along with the direction from the anode side to the cathode (reflecting electrode) side of the light-emitting layer, because the position dependency of an influence from optical interference can be more accurately reduced, and a chromaticity change of emission can be prevented when the current density is changed.

It is preferred that the light-emitting layer satisfies the relationship of a/b>1.05, because a chromaticity change of emission can be effectively prevented when the current density is changed. Here, a denotes the ratio of the concentration of the association having the emission peak at the longer wavelength side to the concentration of the monomer having the emission peak at the shorter wavelength is side on the cathode side of the light-emitting layer, and b denotes the aforementioned concentration ratio on the anode side of the light-emitting layer. The ratio (a/b) is more preferably 1.1 to 2.0.

An intensity ratio [(D/C)×100] of an integral spectrum intensity D of the association to an integral spectrum intensity C of the monomer is 20% or more, preferably 25% to 400%, and more preferably 50% to 200%. When the intensity ratio [(D/C)×100] is less than 20%, emission from the association may not be observed.

Here, the integral spectrum intensity of the monomer and the integral spectrum intensity of the association can be measured, for example, by measuring emission spectrum of the resulting EL element, then separating a spectrum of the monomer and a spectrum of the association from the obtained emission spectrum by fitting, and obtaining integrated intensity of each component.

<Light-Emitting Layer>

The light-emitting layer contains a luminescent material, and a host material, and may further contain other components, if necessary.

The light-emitting layer preferably belong to either of the following two embodiments.

(1) An embodiment in which the light-emitting layer contains one luminescent material whose monomer and association each give a different emission peak (a material capable of emitting light due to molecular association, and emitting white light by itself)

(2) An embodiment in which the light-emitting layer contains two or more luminescent materials each giving a different emission peak (a material containing at least two luminescent materials each of which emits different color of light)

<<Luminescent Material>>

As the luminescent material, both of a phosphorescent material and a fluorescent material can be used, but the phosphorescent material is particularly preferable as it gives high emission efficiency.

—(1) Material Emitting Light Due to Molecular Association and Emitting White Light by Itself—

The material that emits light due to molecular association and emits white light by itself is preferably a phosphorescent material, and more preferably a platinum complex.

Examples of ligands of the platinum complex include those described in "Comprehensive Coordination Chemistry" authored by G. Wilkinson, published by Pergamon Press Ltd. (1987), "Photochemistry and Photophysics of Coordination Compounds" authored by H. Yersin, published by Springer-Verlag Co. in 1987, and "Yuhki Kinzoku Kagaku-Kiso To Ouyou (Organic Metal Chemistry—Devices and Applications) authored by Akio Yamamoto, published by Shokabo Publishing Co., Ltd. in 1982.

Specific examples of the ligand include a halogen ligand (preferably a chlorine ligand), an aromatic carbon ring ligand (e.g. a cyclopentadienyl anion, a benzene anion, and a naphthyl anion), a nitrogen-containing heterocyclic ligand (e.g. phenylpyridine, benzoquinoline, quinolinol, bipyridyl, and phenanthroline), a diketone ligand (e.g. acetylacetone), a carboxylic acid ligand (e.g. an acetic acid ligand), an alcoholate ligand (e.g. a phenolate ligand), a carbon monoxide ligand, an isonitryl ligand, and a cyano ligand. Among them, the nitrogen-containing heterocyclic ligand is particularly preferable.

The complex may contain one transition metal atom in the compound thereof, or may be a binuclear complex having two or more transition metal atoms. In the case of the binuclear complex, the complex may contain two or more transmition metal atoms that are different from each other. Among them, as the phosphorescent material, those expressed by the following formulae can be listed as examples, but it is not limited to these examples.

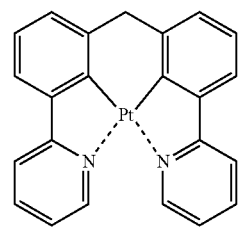

-continued
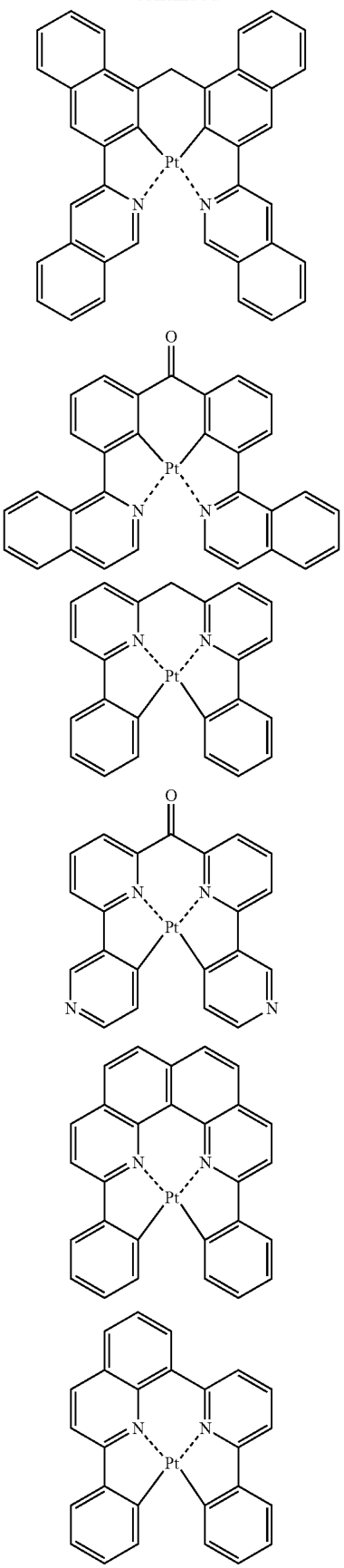
-continued
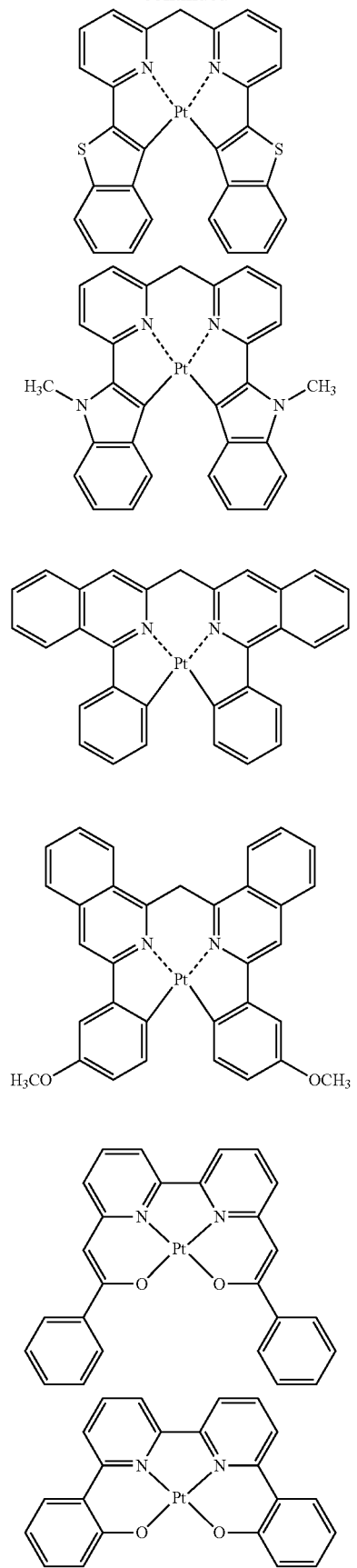

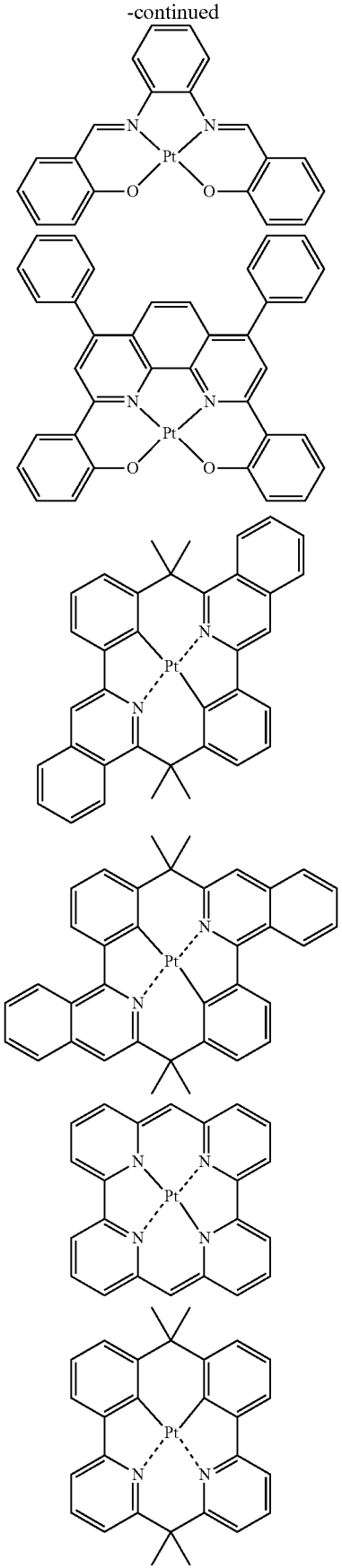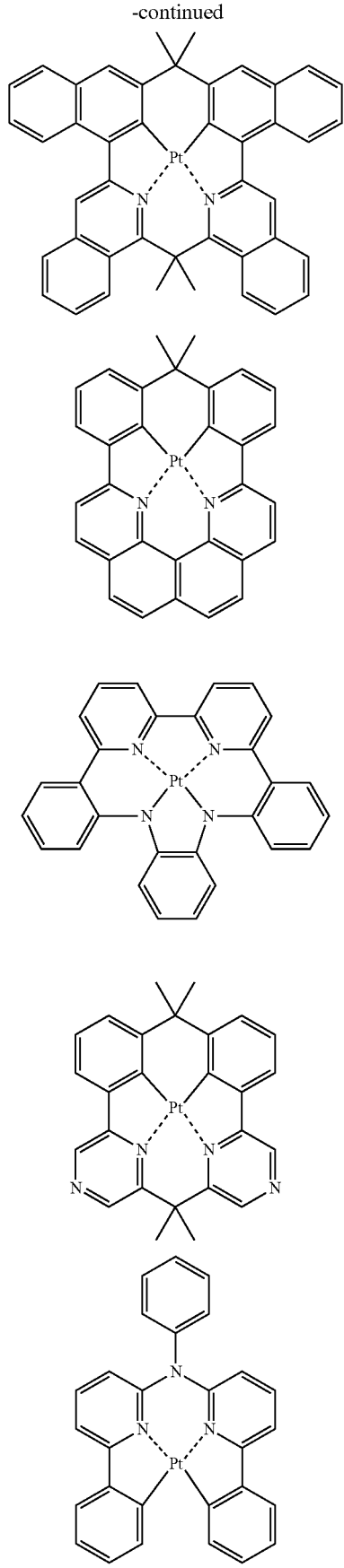

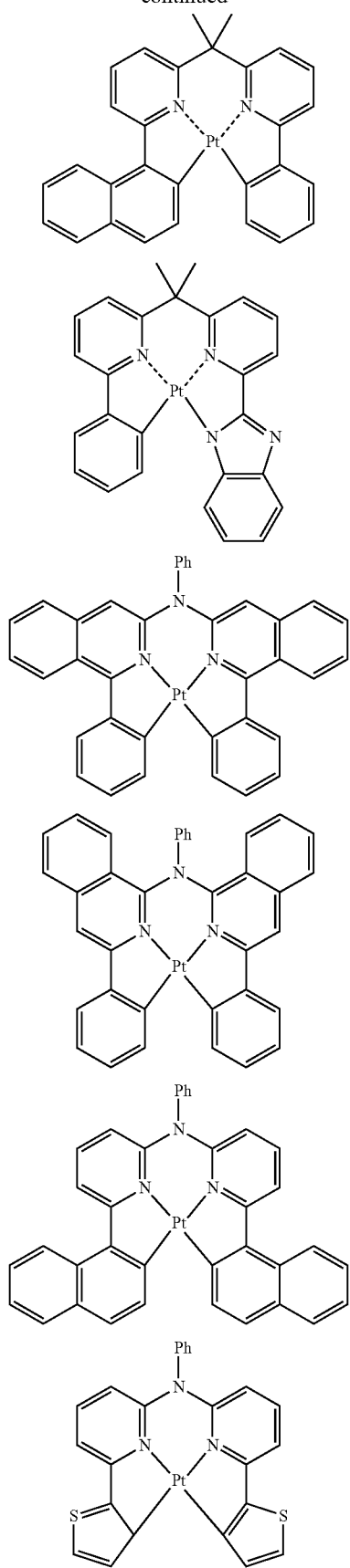
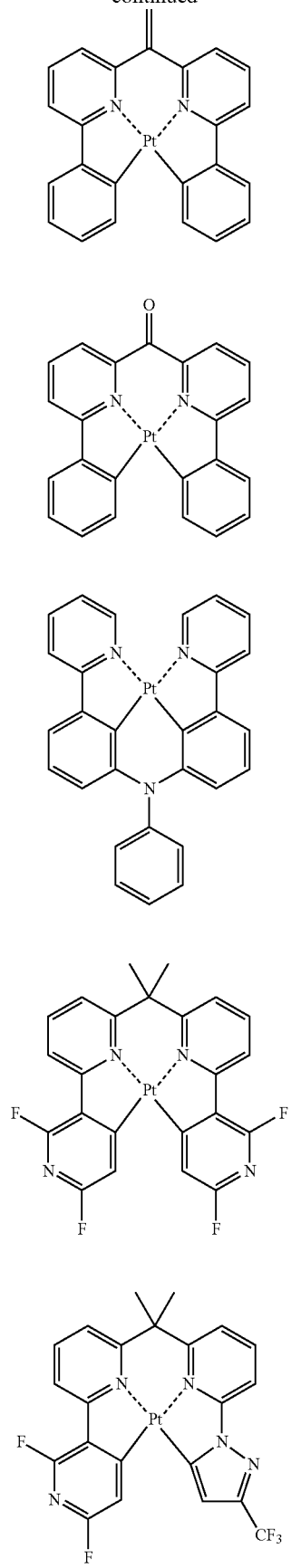

-continued

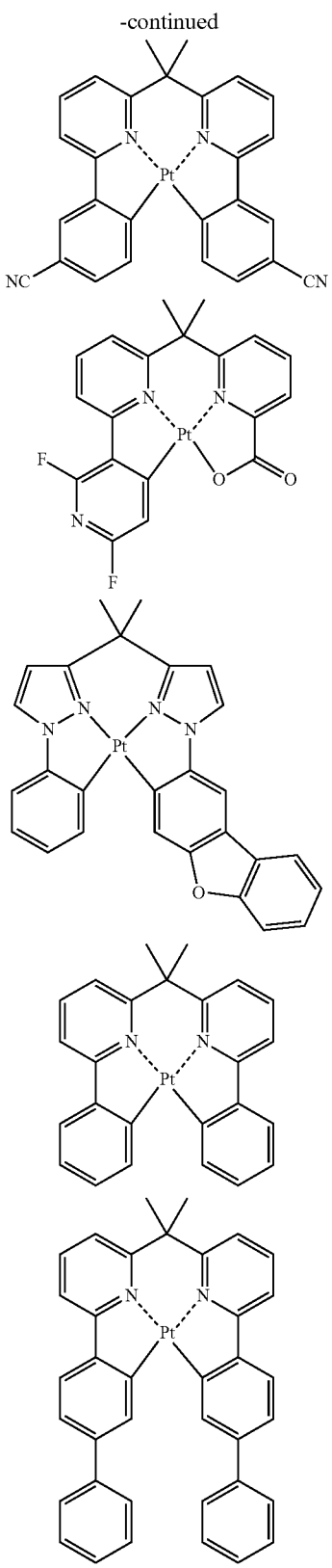

The doping amount of the platinum complex is preferably 10% by mass to 90% by mass, more preferably 20% by mass to 60% by mass, and even more preferably 30% by mass to 50% by mass, relative to the host material.

—(2) Material Containing at Least Two Luminescent Materials Each Emitting a Different Color of Light—

As the luminescent material of (2), both a phosphorescent material and a fluorescent material can be used, but the phosphorescent material is particularly preferable.

—Phosphorescent Material—

The phosphorescent material is suitably selected depending on the intended purpose without any restriction, and examples thereof include metal complex containing a transition metal atom or lanthanoid atom.

Examples of the transition metal atom include ruthenium, rhodium, palladium, tungsten, rhenium, osmium, iridium, and platinum. Among them, rhenium, iridium and platinum are preferable, and iridium is particularly preferable.

Examples of ligands of the complex include those described in "Comprehensive Coordination Chemistry" authored by G. Wilkinson, published by Pergamon Press Ltd. (1987), "Photochemistry and Photophysics of Coordination Compounds" authored by H. Yersin, published by Springer-Verlag Co. in 1987, and "Yuhki Kinzoku Kagaku-Kiso To Ouyou (Organic Metal Chemistry—Devices and Applications) authored by Akio Yamamoto, published by Shokabo Publishing Co., Ltd. in 1982.

Specific examples of the ligand include a halogen ligand (preferably a chlorine ligand), an aromatic carbon ring ligand (e.g. a cyclopentadienyl anion, a benzene anion, and a naphthyl anion), a nitrogen-containing heterocyclic ligand (e.g. phenylpyridine, benzoquinoline, quinolinol, bipyridyl, and phenanthroline), a diketone ligand (e.g. acetylacetone), a carboxylic acid ligand (e.g. an acetic acid ligand), an alcoholate ligand (e.g. a phenolate ligand), a carbon monoxide ligand, an isonitryl ligand, and a cyano ligand. Among them, the nitrogen-containing heterocyclic ligand is particularly preferable.

The complex may contain one transition metal atom in the compound thereof, or may be a binuclear complex having two or more transition metal atoms. In the case of the binuclear complex, the complex may contain two or more transmition metal atoms that are different from each other. Among them, as the phosphorescent material, those expressed by the following formulae can be listed as examples, but it is not limited to these examples.

The phosphorescent material, that is the complex containing iridium, is suitably selected depending on the intended purpose without any restriction, but it is preferably the compound expressed by any of the following general formulae (1), (2) and (3):

General Formula (1)

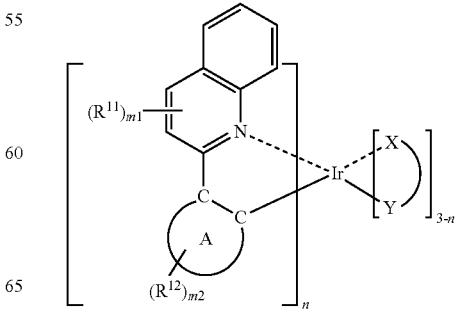

General Formula (2)

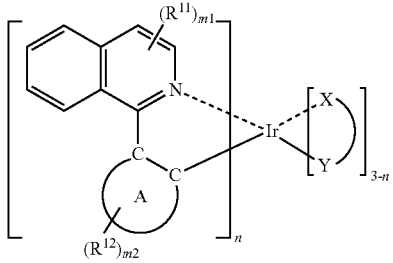

General Formula (3)

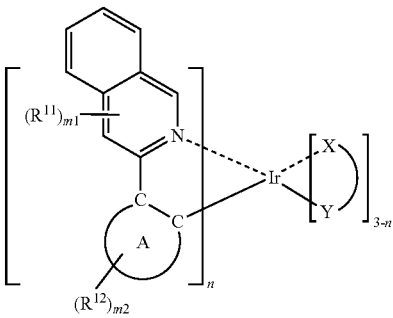

Note that, in the general formulae (1), (2) and (3), n is an integer of 1 to 3; X—Y is a bidentate ligand; a ring A is a cyclic structure that may contain any one of a nitrogen atom, a sulfur atom, and an oxygen atom; $R^{11}$ is a substituent; m1 is an integer of 0 to 6, and when m1 is any of 2 to 6 a plurality of $R^{11}$ adjacent to each other may be bonded to each other to form a ring containing any one of a nitrogen atom, a sulfur atom, and an oxygen atom, and such ring may further contain a substituent; and $R^{12}$ is a substituent; m2 is an integer of 0 to 4, and when m2 is any of 2 to 4 a plurality of $R^{12}$ adjacent to each other may be bonded to each other to form a ring containing any one of a nitrogen atom, a sulfur atom, and an oxygen atom, and such ring may further contain a substituent. Note that, $R^{11}$ and $R^{12}$ may be bonded to each other to form a ring containing any one of a nitrogen atom, a sulfur atom, and an oxygen atom, and such ring may further contain a substituent.

The ring A is a cyclic structure which may contain any one of a nitrogen atom, sulfur atom, and oxygen atom, and suitable examples thereof include 5-membered ring, and 6-membered ring. The ring may further contain a substituent.

X—Y is a bidentate ligand, and examples thereof include a bidentate monoanionic ligand.

Examples of the bidentate monoanionic ligand include picolinate (pic), acetylacetonate (acac), and dipivaloylmethanate (t-butylacac).

Examples of the ligand other than mentioned above include ligands described in pp. 89-91 of International Publication No. WO 2002/15645 by Lamansky et al.

The substituents expressed as $R^{11}$ and $R^{12}$ are suitably selected depending on the intended purpose without any restriction, and for example such substituent is an aryl group that may contain a halogen atom, alkoxy group, amino group, alkyl group, cycloalkyl group, nitrogen atom or sulfur atom, or an aryloxy group that may contain a nitrogen atom or sulfur atom. These substituents may further contain a substituent.

$R^{11}$ and $R^{12}$ may be bonded to each other to form a ring that may contain a nitrogen atom, sulfur atom or oxygen atom, and preferable examples of such ring include a 5-membered ring and 6-membered ring. The ring may further contain a substituent.

Examples of the specific compound expressed by any of the general formulae (1), (2) and (3) include those listed below, but not limited to them.

(I-1)

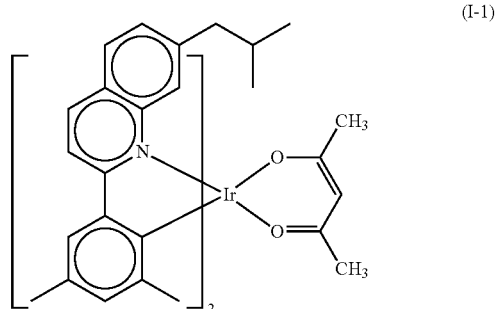

(I-2)

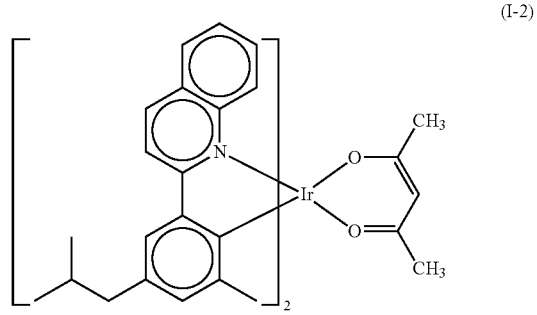

(I-3)

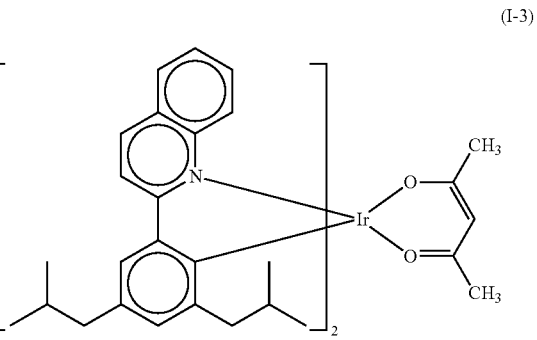

(I-4)

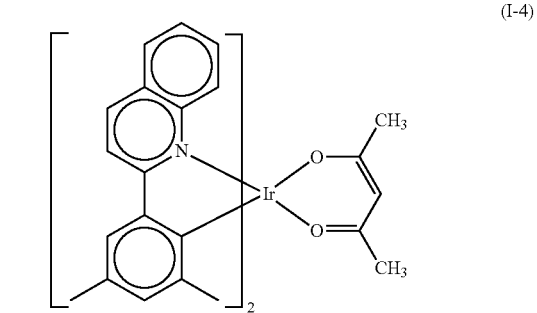

(I-5)

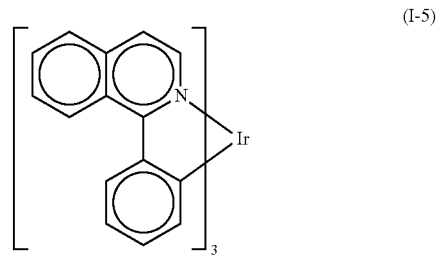

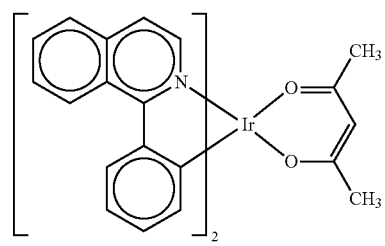
(I-6)
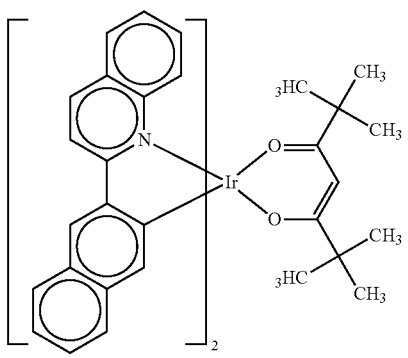
(I-7)
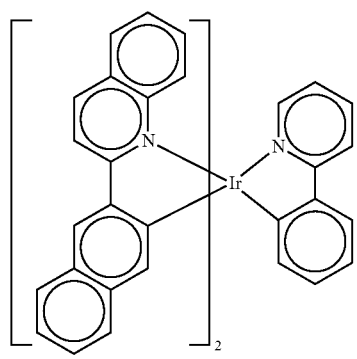
(I-8)
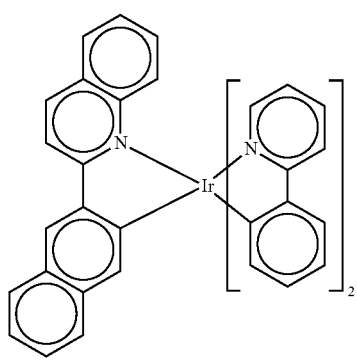
(I-9)
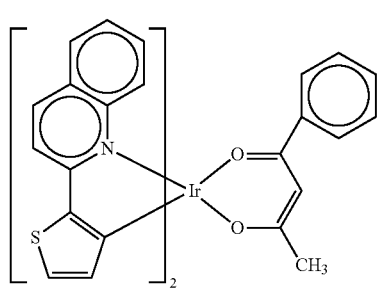
(I-10)
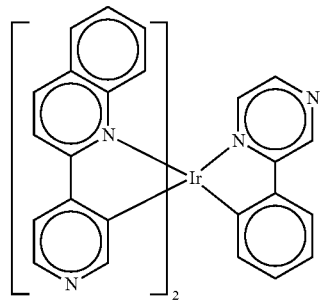
(I-11)
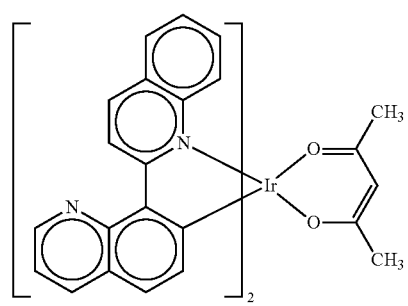
(I-12)
(I-13)
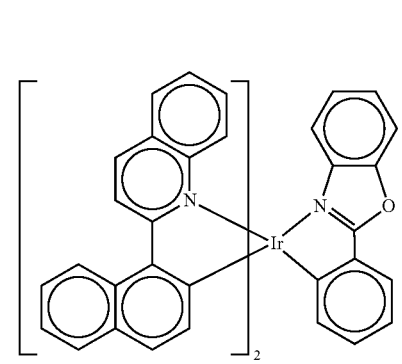
(I-14)
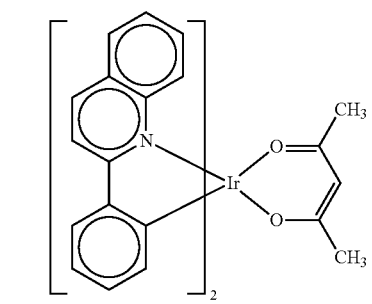
(I-15)

-continued
(I-16)
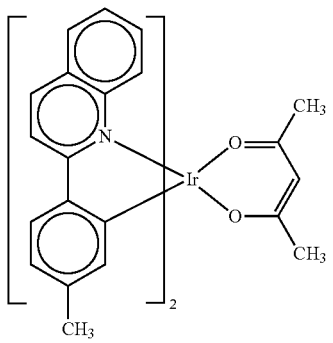
(I-17)
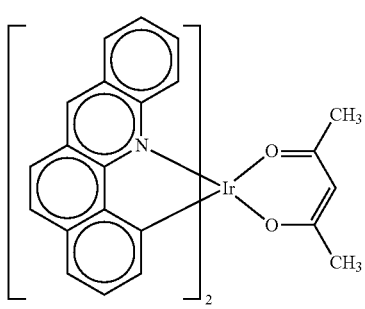
(I-18)
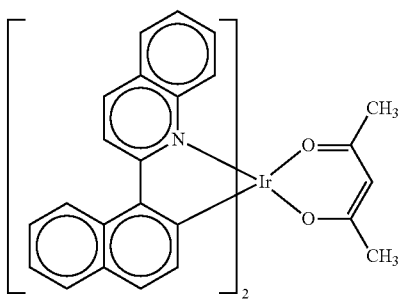
(I-19)
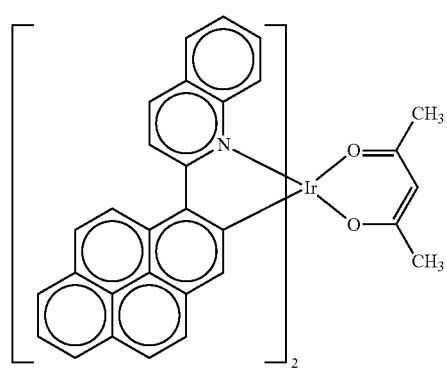
(I-20)
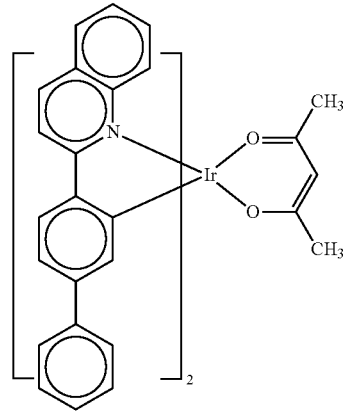
(I-21)
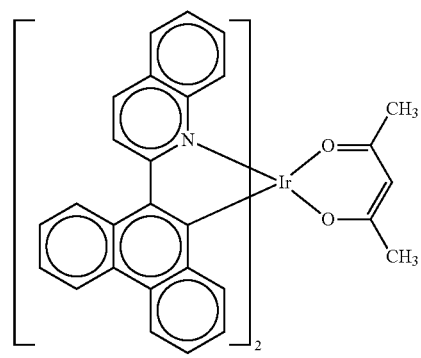
(I-22)
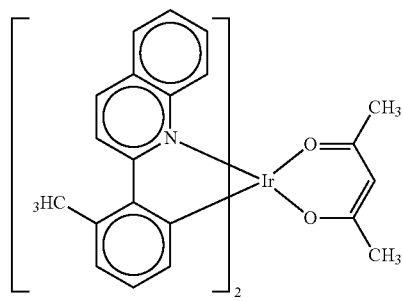
(I-23)
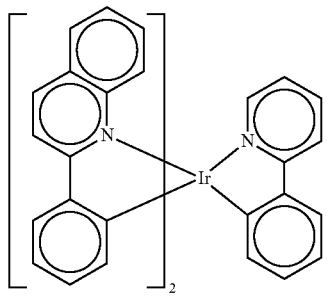

(I-24)
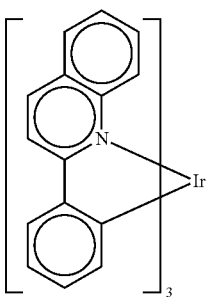
(I-25)
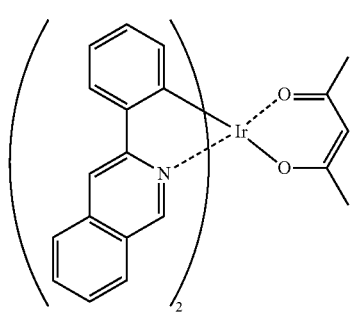
(I-26)
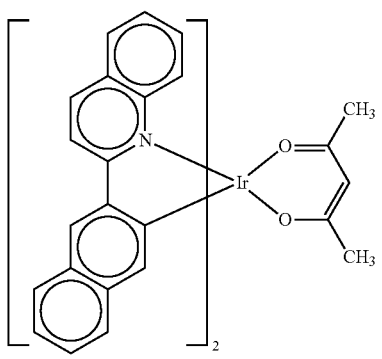
Other examples of the phosphorescent material are those compounds listed below:
D-1
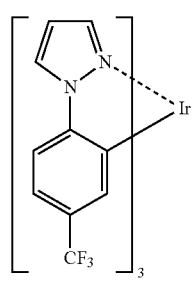
D-2
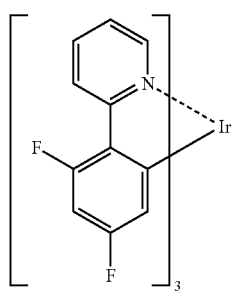
D-3
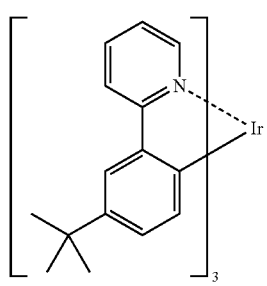
D-4
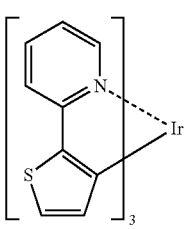
D-5
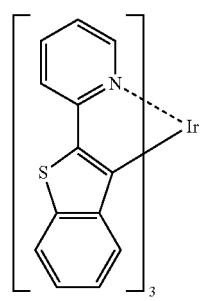
D-6
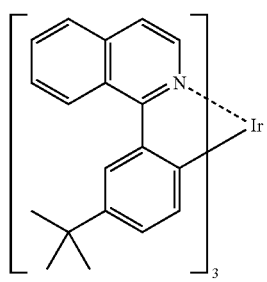
D-7
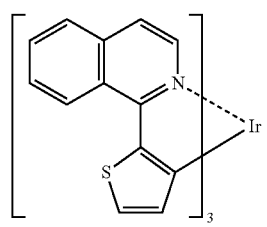

D-8 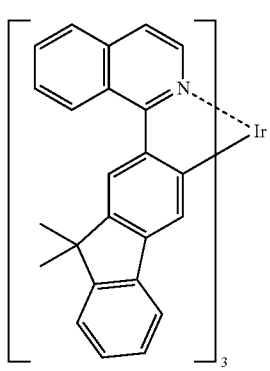
D-9 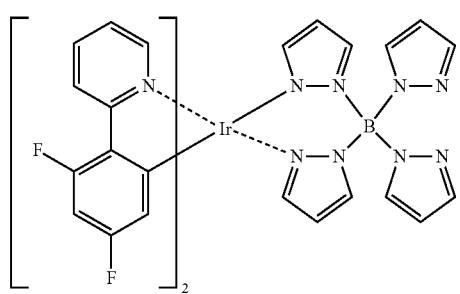
D-10 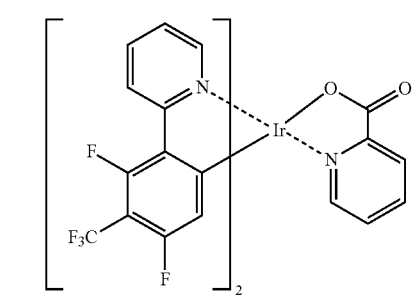
D-11 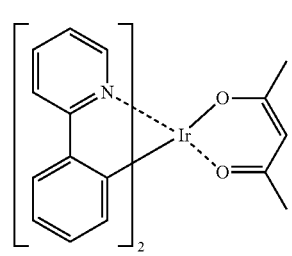
D-12 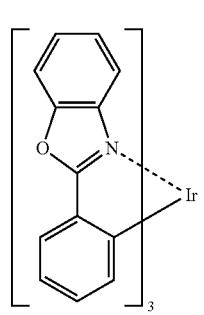
D-13 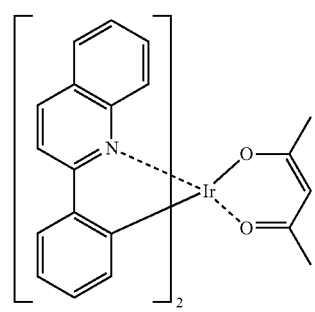
D-14 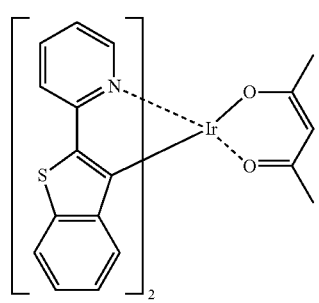
D-15 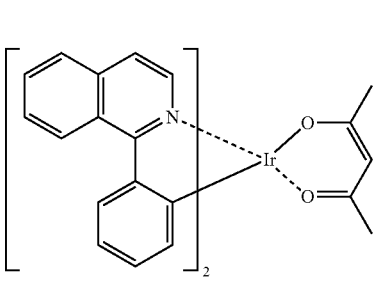
D-16 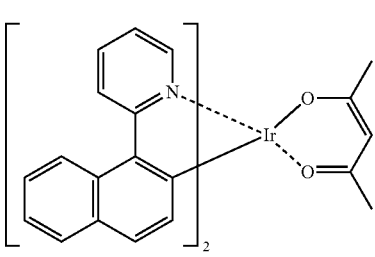
D-17 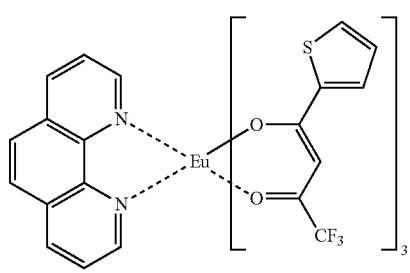

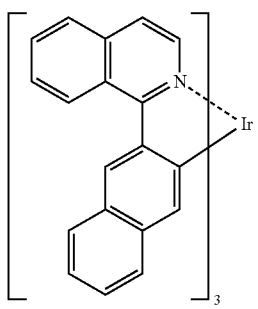 D-18
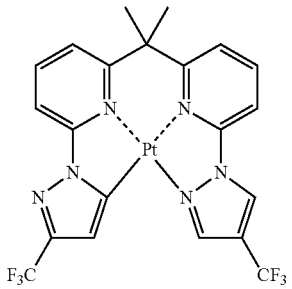 D-23
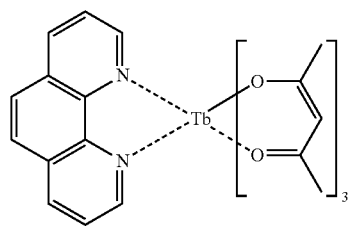 D-19
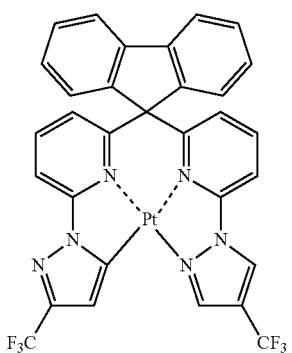 D-24
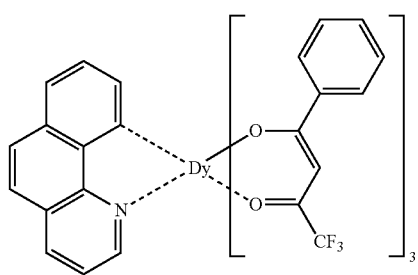 D-20
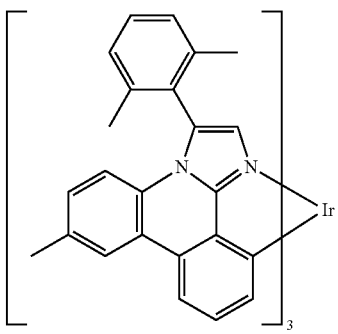
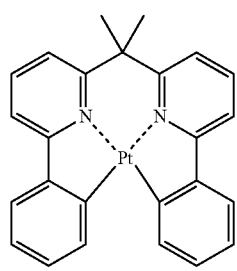 D-21
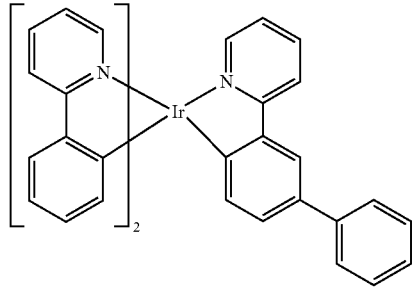
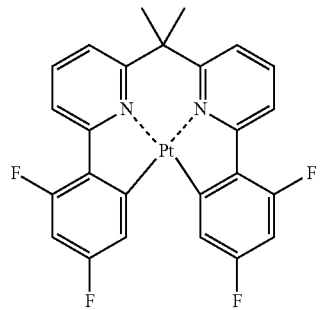 D-22
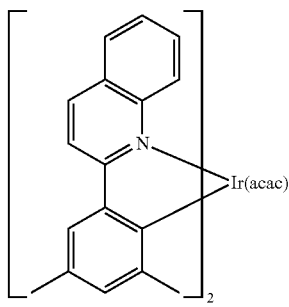

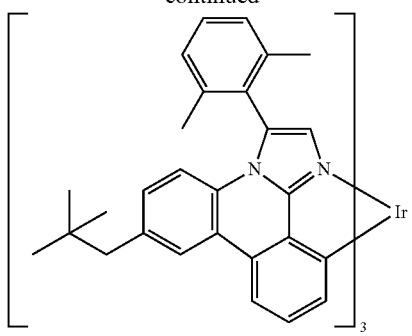

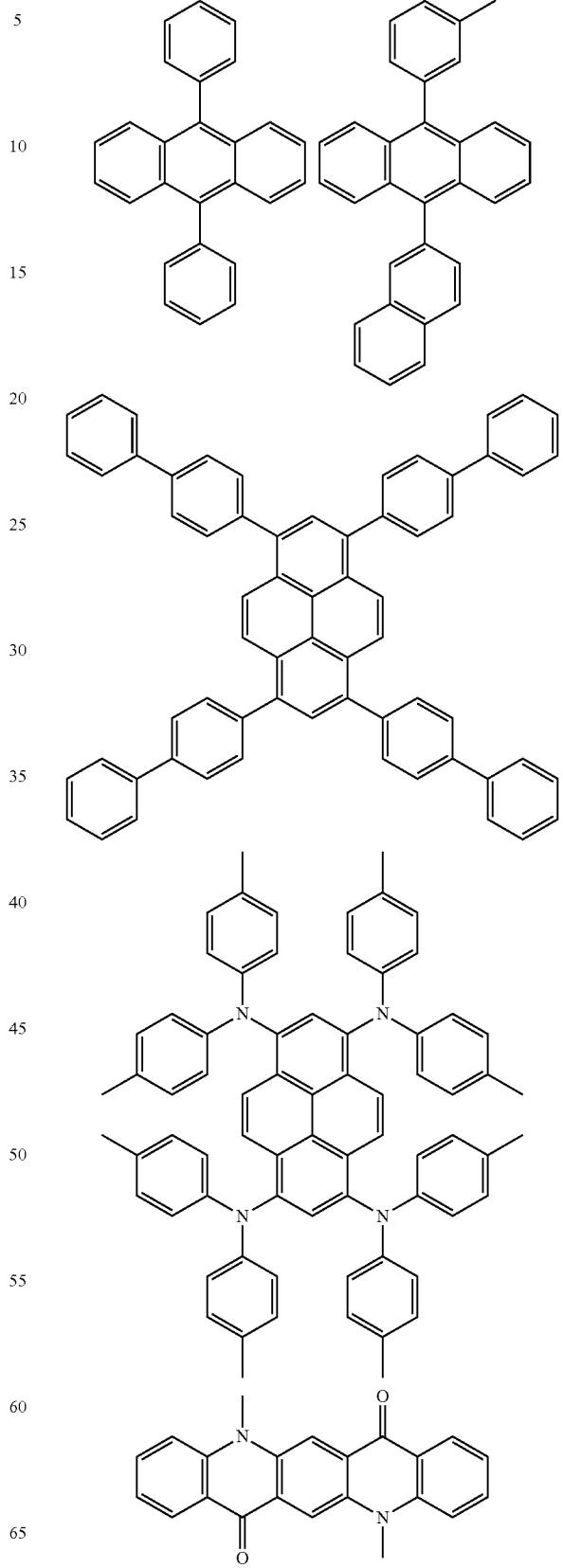

The total amount of the phosphorescent material is preferably 0.5% by mass to 30% by mass, more preferably 0.5% by mass to 20% by mass, and even more preferably 3% by mass to 10% by mass, relative to the total mass of the light-emitting layer.

—Fluorescent Material—

The fluorescent material is suitably selected depending on the intended purpose without any restriction. Examples thereof include benzoxazole, benzimidazole, benzthiazole, styrylbenzene, polyphenyl, diphenylbutadiene, tetraphenylbutadiene, naphthalimide, coumarin, pyran, perinone, oxadiazole, aldazine, pyralidine, cyclopentadiene, bisstyrylanthracene, quinacridon, pyrrolopyridine, thiadiazolopyridine, styrylamine, aromatic dimethylidyne compounds, condensed polycyclic aromatic compounds (e.g. anthracene, phenanthroline, pyrene, perylene, rubrene, and pentacene), various metal complexes such as a metal complex of 8-quinolinol, pyrromethene complex and rare earth element complex, polymer compounds such as polythiophene, polyphenylene, and polyphenylenevinylene, and organic silane or derivatives thereof.

Among them, specific examples of the fluorescent material include those listed below, but not limited to them.

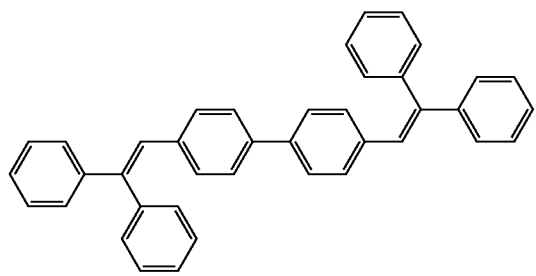

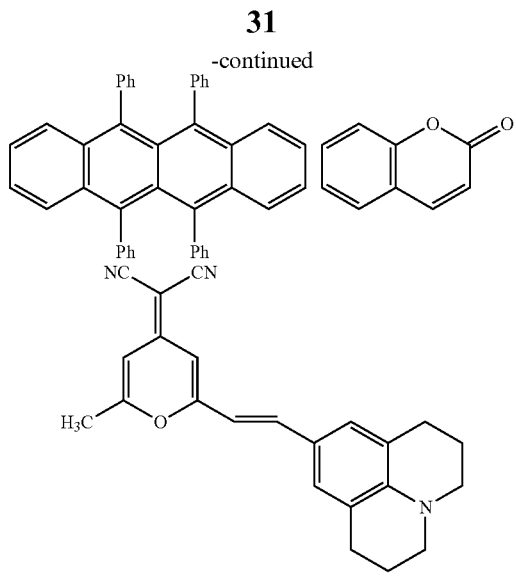

The total amount of the fluorescent material is preferably 0.1% by mass to 30% by mass, more preferably 0.2% by mass to 15% by mass, and even more preferably 0.5% by mass to 12% by mass, relative to the total mass of the light-emitting layer.

<<Host Material>>

The host material is suitably selected depending on the intended purpose without any restriction. For example, a hole-transporting host material which has excellent hole-transporting abilities and an electron-transporting host material which has excellent electron-transporting abilities can be used as the host material.

—Hole-Transporting Host Material—

The hole-transporting host material is suitably selected depending on the intended purpose without any restriction. Examples of the hole-transporting host material include pyrrole, indole, carbazole, azaindole, azacarbazole, pyrazole, imidazole, polyarylalkane, pyrazoline, pyrazolone, phenylene diamine, aryl amine, amino-substituted chalcone, styryl anthracene, fluorenone, hydrazone, stilbene, silazane, an aromatic tertiary amine compound, a styryl amine compound, an aromatic dimethylidine compound, a porphyrin compound, a polysilane compound, poly(N-vinylcarbazole), aniline copolymers, electrically conductive high-molecular oligomers such as thiophene oligomers, polythiophenes and the like, organic silanes, carbon films, derivatives thereof.

Among them, indole derivatives, carbazole derivatives, azaindole derivatives, azacarbazole derivatives, the aromatic tertiary amine compound, and thiophene derivatives are preferable, and the compounds having an indole skeleton, a carbazole skeleton, an azaindole skeleton, an azacarbazole skeleton, or an aromatic tertiary amine skeleton in the molecule thereof are particularly preferable.

Moreover, host materials in which the part of or entire hydrogen atoms of the aforementioned host material are substituted with deuterium can also be used as the host material in the present invention (see JP-A Nos. 2008-126130, and 2004-515506).

Examples of the specific compound of the hole-transporting host material include those listed below, but not limited to them.

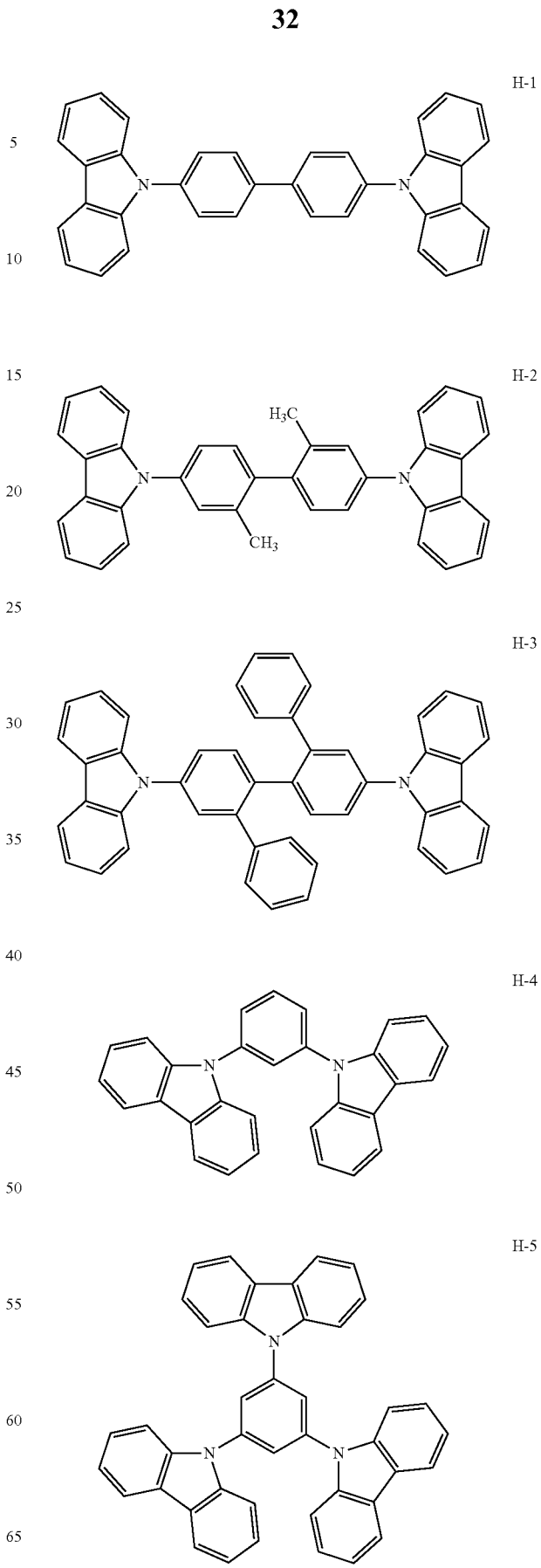

33
-continued
H-6
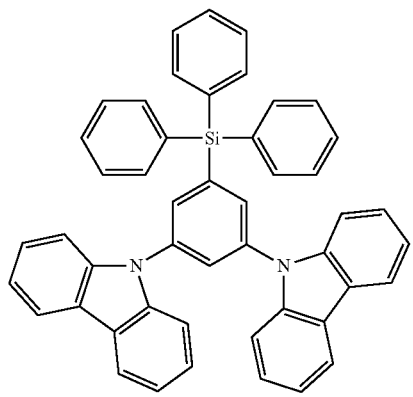
H-7
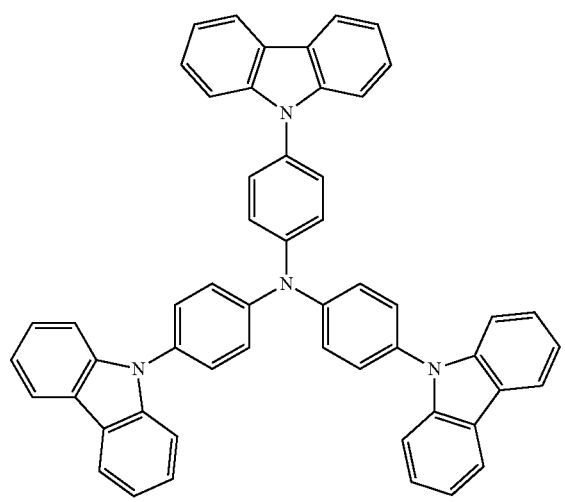
H-8
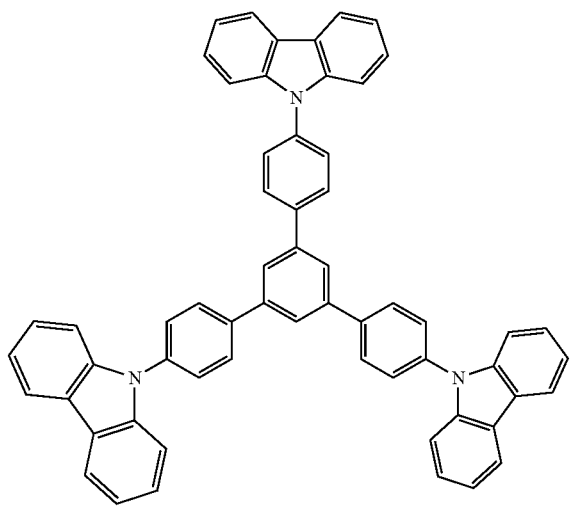
34
-continued
H-9
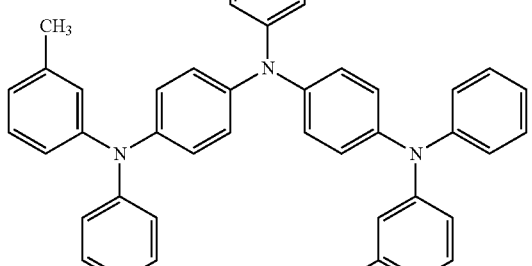
H-10
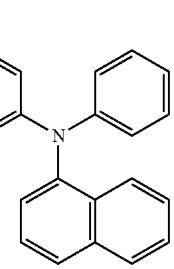
H-11
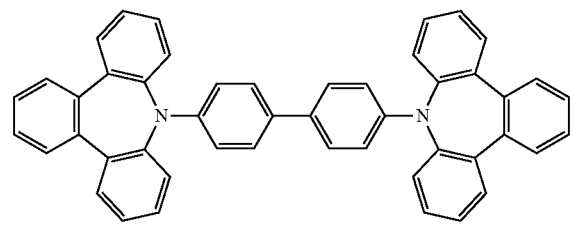
H-12
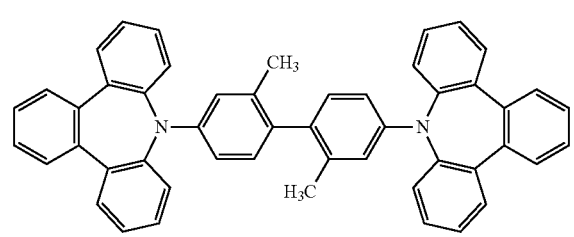

H-13
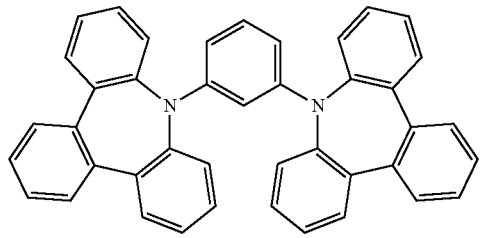
H-14
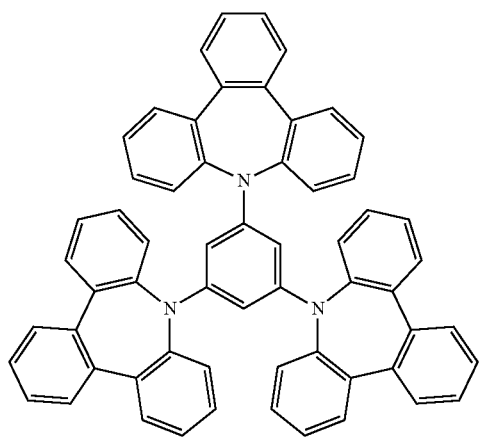
H-15
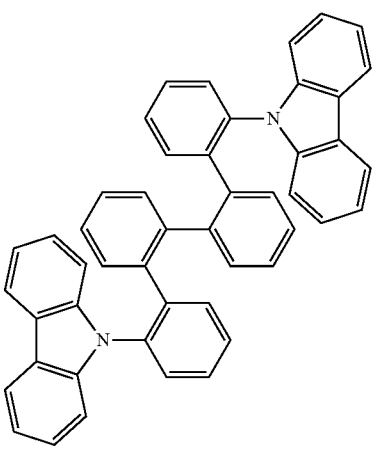
H-16
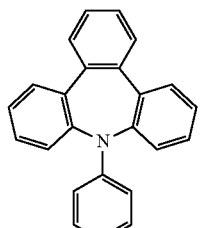
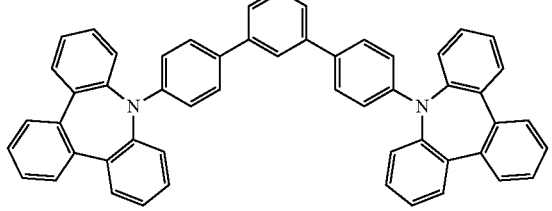
H-17
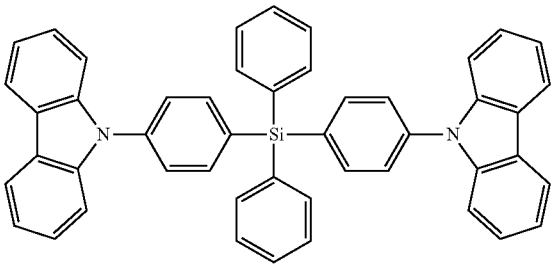
H-18
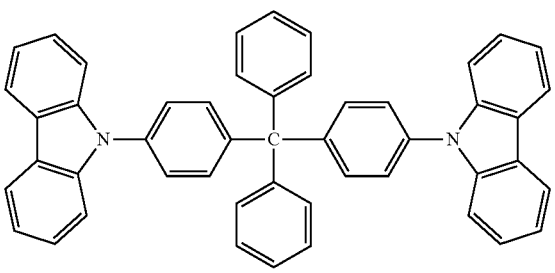
H-19

H-20
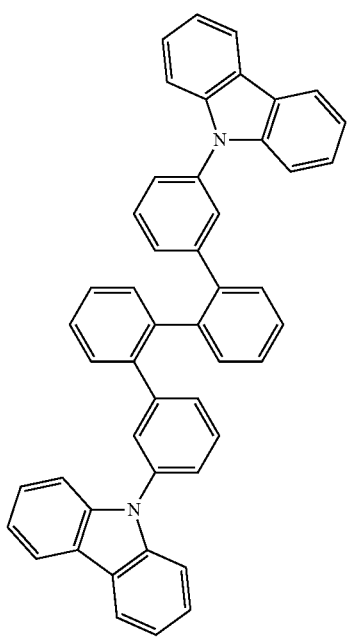
H-22
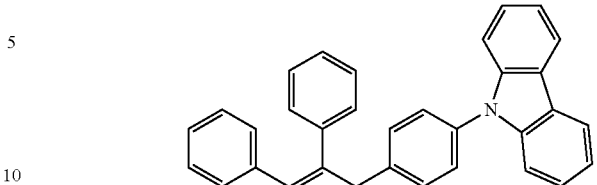
H-23
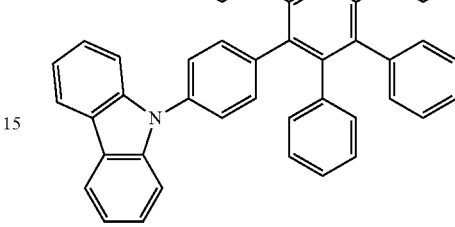
H-24
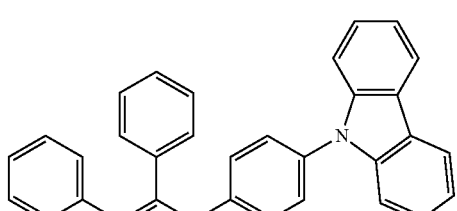
H-25
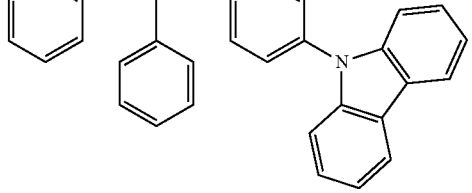
H-21
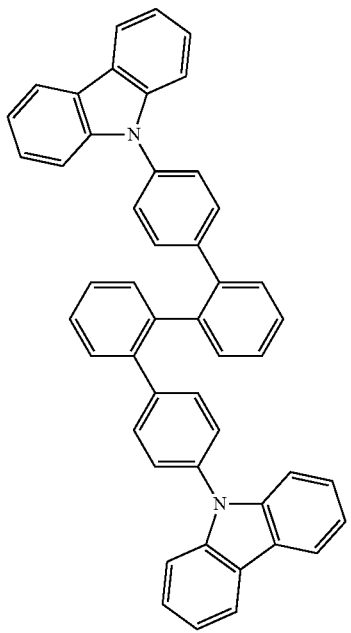

H-26

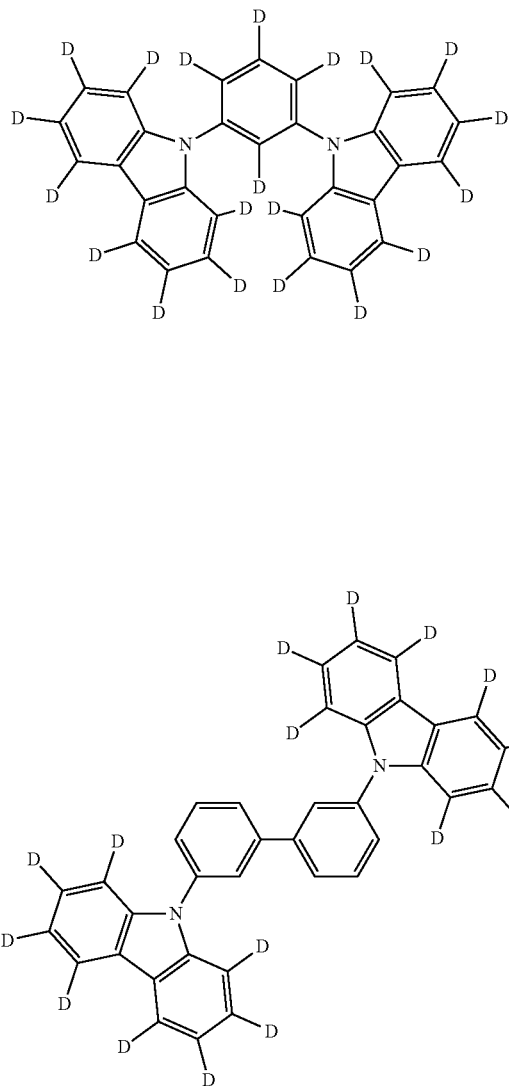

H-27

H-28

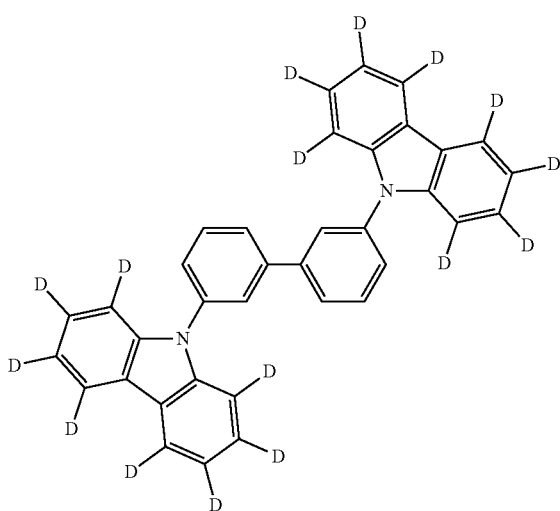

H-29

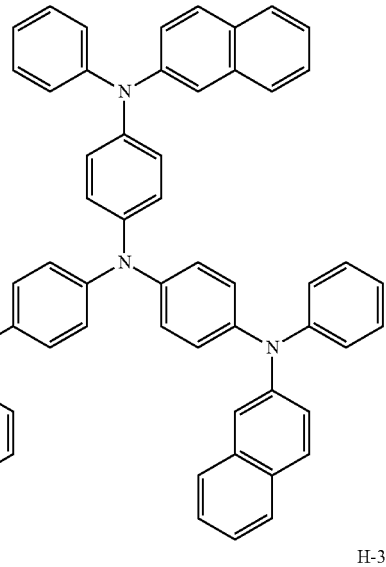

H-30

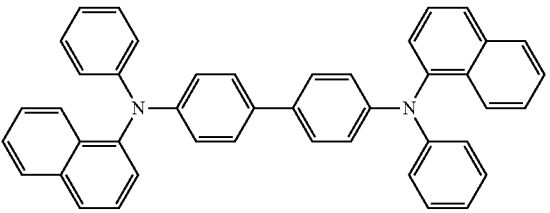

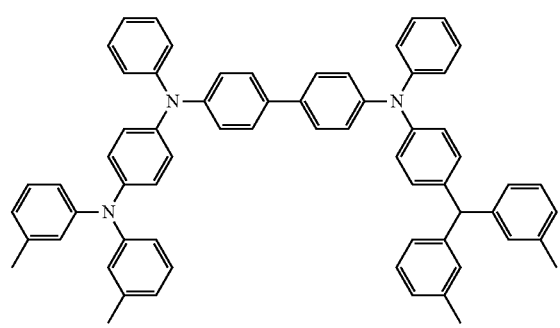

The amount of the hole-transporting host material is preferably 10% by mass to 99.9% by mass, more preferably 20% by mass to 99.5% by mass, and even more preferably 30% by mass to 99% by mass, relative to the total mass of the light-emitting layer.

—Electron-Transporting Host Material—

The electron-transporting host material is suitably selected depending on the intended purpose without any restriction. Examples thereof include pyridine, pyrimidine, triazine, imidazole, pyrazole, triazole, oxazole, oxadiazole, fluorenone, anthraquinodimethane, anthrone, diphenylquinone, thiopyran dioxide, carbodiimido, fluorenylidene methane, distyrylpyrazine, heterocyclic tetracarboxylic acid anhydride such as fluorinated aromatic compounds and naphthalene perylene, phthalocyanine, or derivatives thereof (which may form a condensed ring with another ring), a metal complex of a 8-quinolinol derivative, and various metal complexes having a ligand of metal phthalocyanine, benzoxazole, or benzthiazole.

Examples of the electron-transporting host material also include metal complexes, azole derivatives (e.g. benzoimidazole derivatives, and imidazopyridine derivatives), and azine derivatives (e.g. pyridine derivatives, pyrimidine derivatives, and triazine derivatives). Among them, the metal complex compound is preferably used in the present invention in view of its excellent permanence. The metal complex compound is preferably a metal complex having a ligand containing at least one nitrogen atom, oxygen atom or sulfur atom coordinated to the metal ion.

The metal ion contained in the metal complex is suitably selected depending on the intended purpose without any restriction. Examples thereof include beryllium ion, magnesium ion, aluminum ion, gallium ion, zinc ion, indium ion, tin ion, platinum ion, and palladium ion. Among them, beryllium ion, aluminum ion, gallium ion, zinc ion, platinum ion, and palladium ion are preferable, and aluminum ion, zinc ion, and palladium ion are more preferable.

The ligand contained in the metal complex may be selected from various ligands known in the art without any restriction, and examples thereof include those described in "Photochemistry and Photophysics of Coordination Compounds" authored by H. Yersin, published by Springer-Verlag Co. in 1987, and "Yuhki Kinzoku Kagaku-Kiso To Ouyou (Organic Metal Chemistry, Basic to Its Applications) authored by Akio Yamamoto, published by Shokabo Publishing Co., Ltd. in 1982, and the like.

The ligand is preferably a nitrogen-containing heterocyclic ligand (preferably of C1 to C30, more preferably C2 to C20, even more preferably C3 to C15), and may be a monodentate ligand, or a bidentate or high polydentate ligand, preferably a ligand having the denticity of 2 to 6. Moreover, the mixed ligands of the ligand having the denticity of 2 to 6 and a monodentate ligand are also preferable for the ligand.

Examples of the ligand include an azine ligand (e.g. a pyridine ligand, bipyridyl ligand, and ter-pyridine ligand), a hydroxyphenylazole ligand (e.g. a hydroxyphenylbenzimidazole ligand, hydroxyphenylbenzoxazole ligand, hydroxyphenylimidazole ligand, and hydroxyphenylimidazopyridine ligand), an alkoxy ligand (preferably C1 to C30, more preferably C1 to C20, and even more preferably C1 to C10, such as methoxy, ethoxy, butoxy, and 2-ethylhexyloxy), an aryloxy ligand (preferably C6 to C30, more preferably C6 to C20, and even more preferably C6 to C12, such as phenyloxy, 1-nephthyloxy, 2-nephthyloxy, 2,4,6-trimethylphenyloxy, and 4-biphenyloxy), a heteroaryloxy ligand (preferably C1 to C30, more preferably C1 to C20, and even more preferably C1 to C12, such as pyridyloxy, pyrazyloxy, pyrimidyloxy, and quinolyloxy), an alkylthio ligand (preferably C1 to C30, more preferably C1 to C20, and even more preferably C1 to C12, such as methylthio, and ethylthio), an arylthio ligand (preferably C6 to C30, more preferably C6 to C20, and even more preferably C6 to C12, such as phenylthio), a heteroarylthio ligand (preferably C1 to C30, more preferably C1 to C20, and even more preferably C1 to C12, such as pyridylthio, 2-benzimizolylthio, 2-benzoxazolylthio, and 2-benzthiazolylthio), a siloxy ligand (preferably C1 to C30, more preferably C3 to C25, and even more preferably C6 to C20, such as a triphenylsiloxy group, triethoxysilosy group, and triisopropylsiloxy group), an aromatic hydrocarbon anion ligand (preferably C6 to C30, more preferably C6 to C25, and even more preferably C6 to C20, such as a phenyl anion, naphthyl anion, and anthranil anion), an aromatic heterocyclic anion ligand (preferably C1 to C30, more preferably C2 to C25, and even more preferably C2 to C20, such as a pyrrole anion, pyrazole anion, triazole anion, oxazole anion, benzoxazole anion, thiazole anion, benzthiazole anion, thiophene anion, and benzthiophene anion), and an indolenine anion ligand. Among them, a nitrogen-containing heterocyclic ligand, aryloxy ligand, heteroaryloxy group, and siloxy ligand are preferable, and the nitrogen-containing heterocyclic ligand, aryloxy ligand, siloxy ligand, aromatic hydrocarbon anion ligand, aromatic heterocyclic anion ligand are more preferable.

As the metal complex electron-transporting host material, the compounds described, for example, in JP-A Nos. 2002-235076, 2004-214179, 2004-221062, 2004-221065, 2004-221068, and 2004-327313 are known.

Specific examples of such electron-transporting host material include the materials listed below, but not limited to them.

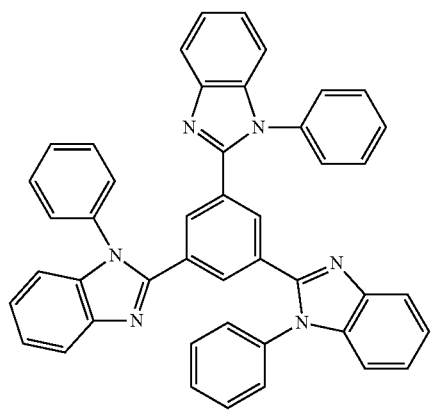

E-1

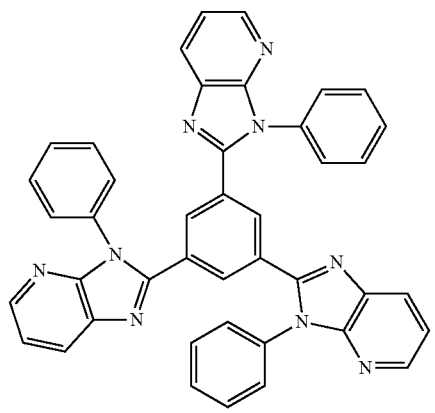

E-2

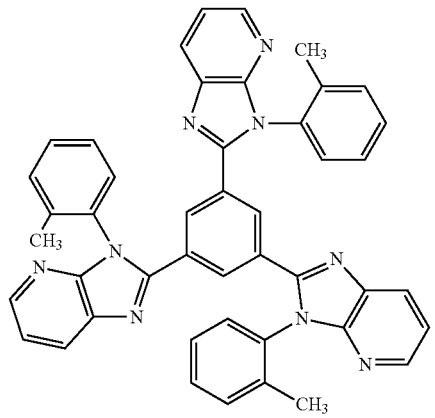

E-3

-continued
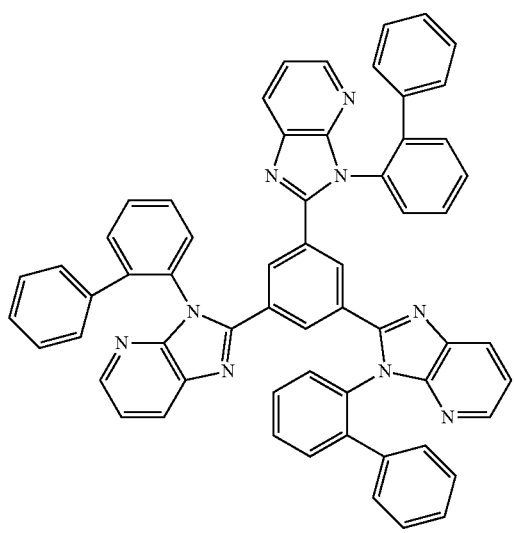
E-4
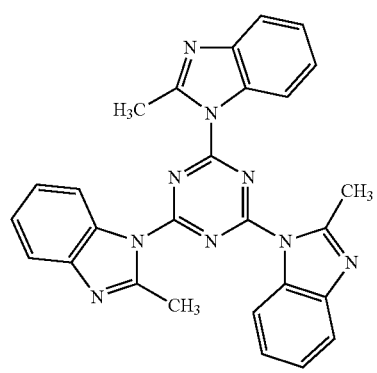
E-5
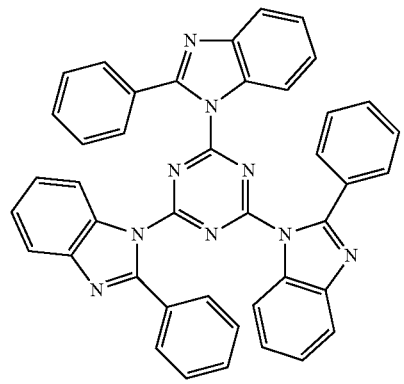
E-6
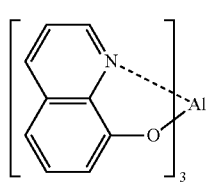
E-7
-continued
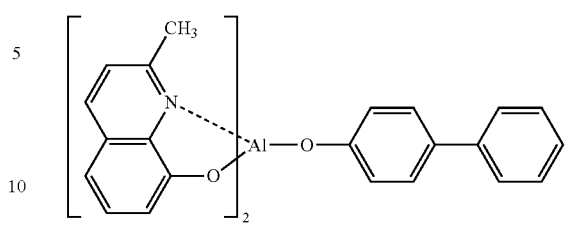
E-8
E-9
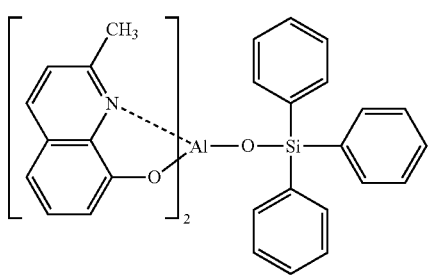
E-10
E-11
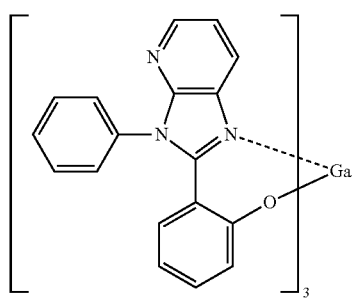
E-12

E-13
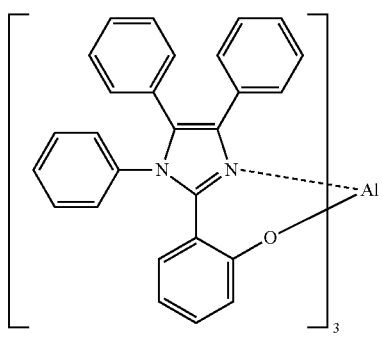

E-14
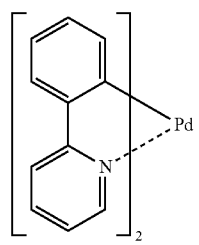

E-15
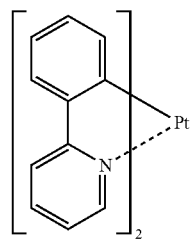

E-16
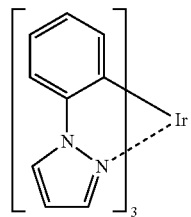

E-17
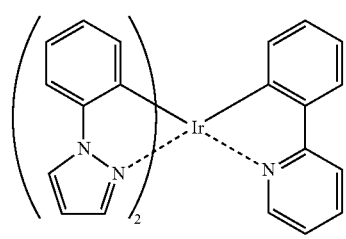

E-18
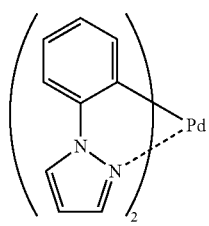

E-19
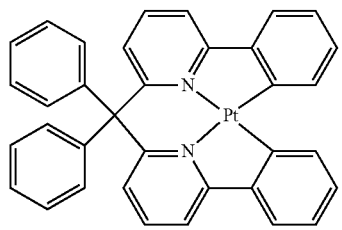

E-20
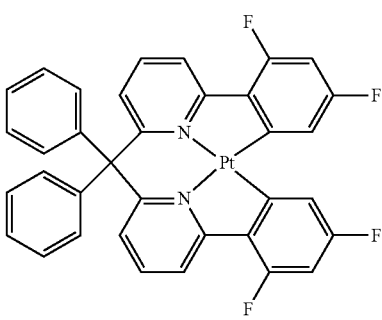

E-21
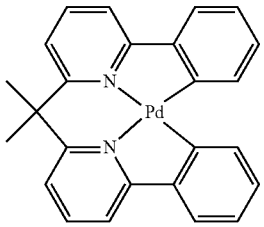

E-22
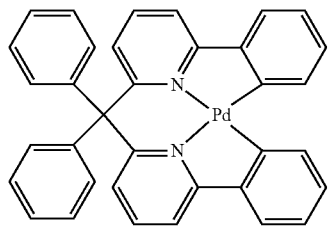

The amount of the electron-transporting host material is preferably 10% by mass to 99.9% by mass, more preferably 20% by mass to 99.5% by mass, and even more preferably 30% by mass to 99% by mass, relative to the total mass of the light-emitting layer.

The formation method of the light-emitting layer is suitably selected depending on the intended purpose without any restriction, and examples thereof include resistance heating deposition, vacuum deposition, an electron-beam method, sputtering, molecular stacking, and coating (e.g. spin-coating, casting, and dip-coating). Among them, the vacuum deposition is particularly preferable.

The thickness of the light-emitting layer is suitably selected depending on the intended purpose without any restriction, but it is preferably 20 nm or more, more preferably 25 nm to 100 nm. When the thickness thereof is less than 20 nm, leakage of charges may occur, which reduces the emission efficiency.

<Electron-Injecting Layer and Electron-Transporting Layer>

The electron-injecting layer and electron-transporting layer are layers having functions of receiving electrons from the cathode or the side of the cathode and transporting the electrons to the side of the anode.

The electron-transporting layer contains materials such as the electron-transporting host material, and the electron-donating dopant.

The thickness of the electron-injecting layer, or electron-transporting layer is suitably selected depending on the intended purpose without any restriction, but the thickness of each of the electron-injecting layer and the electron-transporting layer is preferably 500 nm or less for reducing driving voltage.

The thickness of the electron-transporting layer is preferably 1 nm to 500 nm, more preferably 5 nm to 200 nm, and even more preferably 10 nm to 100 nm.

The thickness of the electron-injecting layer is preferably 0.1 nm to 200 nm, more preferably 0.2 nm to 100 nm, and even more preferably 0.5 nm to 50 nm.

The electron-injecting layer and the electron-transporting layer may each have a single-layer structure formed of one material or a mixture of two or more materials, or a multi-layer structure including a plurality of layers in which each layer may be formed of the identical composition or different composition.

<Hole-Injecting Layer and Hole-Transporting Layer>

The hole-injecting layer and hole-transporting layer are layers having functions of receiving holes from the anode or the side of the anode and transporting the holes to the side of the cathode. The hole-injecting layer and the hole-transporting layer may each have a single-layer structure, or a multi-layer structure including a plurality of layers in which each layer may be formed of the identical composition or different composition.

A hole-injecting material or hole-transporting material used for these layers may be a low molecular weight compound or a high molecular weight compound.

The hole-injecting material or hole-transporting material is suitably selected depending on the intended purpose without any restriction, and examples thereof include pyrrole derivatives, carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidyne compounds, phthalocyanine compounds, porphyrin compounds, thiophene derivatives, organic silane derivatives, and carbon. These may be used independently or in combination.

The hole-injecting layer and the hole-transporting layer can also contain an electron-accepting dopant.

The electron-accepting dopant for use may be an inorganic compound or organic compound, provided that it has the electron-receiving properties and abilities to oxidize an organic compound.

The inorganic compound is suitably selected depending on the intended purpose without any restriction, and examples thereof include: metal halides such as iron (II) chloride, aluminum chloride, gallium chloride, indium chloride, and antimony pentachloride; and metal oxides such as vanadium pentaoxide, and molybdenum trioxide.

The organic compound is suitably selected depending on the intended purpose without any restriction, and examples thereof include: compounds having a substituent such as a nitro group, a halogen, a cyano group, and a trifluoromethyl group; a quinone compound; an acid anhydride compound; and fullerene. These may be used independently or in combination.

The amount of the electron-accepting dopant for use is not restricted in any way and is varied depending on the type of the material for use. The amount thereof is preferably 0.01% by mass to 50% by mass, more preferably 0.05% by mass to 30% by mass, and even more preferably 0.1% by mass to 30% by mass, relative to the hole-transporting material or hole-injecting material.

The hole-injecting layer and the hole-transporting layer can be formed in accordance with methods know in the art without any restriction. The hole-injecting layer and the hole-transporting layer can be suitably formed, for example, by a dry film-forming method such as deposition and sputtering, a wet-coating, transferring, printing, and an inkjet method.

The thickness of each of the hole-injecting layer and the hole-transporting layer is preferably 1 nm to 500 nm, more preferably 5 nm to 250 nm, and even more preferably 10 nm to 200 nm.

<Hole-Blocking Layer and Electron-Blocking Layer>

The hole-blocking layer is a layer having functions of preventing holes transported from the side of the anode to the light-emitting layer from passing through to the side of the cathode, and is generally provided, as an organic compound layer, adjacent to the light-emitting layer on the side of the cathode.

The electron-blocking layer is a layer having functions of preventing electrons transported from the side of the cathode to the light-emitting layer from passing through to the side of the anode, and is generally provided, as an organic compound layer, adjacent to the light-emitting layer on the side of the anode.

Examples of the compound for forming the hole-blocking layer include aluminum complexes such as BAlq; triazole derivatives, and phenanthroline derivatives such as BCP.

As the compound for forming the electron-blocking layer, for example, those mentioned as the hole-transporting material can be used.

The electron-blocking layer and the hole-blocking layer can be formed in accordance with methods know in the art without any restriction. The electron-blocking layer and the hole-blocking layer can be suitably formed, for example, by a dry film-forming method such as deposition and sputtering, a wet-coating, transferring, printing, and an inkjet method.

The thickness of each of the hole-blocking layer and the electron-blocking layer is preferably 1 nm to 200 nm, more preferably 1 nm to 50 nm, and even more preferably 3 nm to 10 nm. Moreover, the hole-blocking layer and electron-blocking layer may each have a single-layer structure formed of one of the aforementioned materials, or a combination thereof, or a multi-layer structure including a plurality of layers in which each layer may be formed of the identical composition or different composition.

<Electrode>

The organic electric field light-emitting element of the present invention contains a pair of electrodes, i.e. an anode and a cathode. In view of the characteristics of the organic electric field light-emitting element of the present invention, at least either of the anode and the below-discussed cathode is preferably transparent. It is preferred that the anode is a transparent or translucent electrode, and the cathode is a reflecting electrode. Generally, the anode has no restriction as long as it has functions as an electrode for supplying holes to the organic compound layer, and the cathode has no restriction as long as it has functions as an electrode for injecting electrons to the organic compound layer.

The shape, structure, size and the like of the electrode are suitably selected from the conventional electrode materials known in the art depending on the use of the organic electric field light-emitting element, and intended purpose without any restriction.

Preferable examples of the material for forming the electrode include metal, alloy, metal oxide, a conductive compound, or a mixture thereof.

—Anode—

Examples of the material for forming the anode include: conductive metal oxide (e.g. antimony or fluorine-doped tin oxide (ATO, FTO), tin oxide, zinc oxide, indium oxide, indium tin oxide (ITO), and indium zinc oxide (IZO)), metal (e.g. gold, silver, and nickel); a mixture or laminate of the metal and the conductive metal oxide; an inorganic conductive material (e.g. copper iodide, and copper sulfide), an organic conductive material (e.g. polyaniline, polythiophene, and polypyrrole), and a laminate of ITO and the above-listed material(s). Among them, the conductive metal oxide is preferable, and ITO is particularly preferable in view of its productivity, high conductivity, and transparency.

—Cathode—

Examples of the material for forming the cathode include alkali metal (e.g. Li, Na, K, and Cs), alkaline earth metal (e.g. Mg, and Ca), gold, silver, lead, aluminum, sodium-potassium alloy, lithium-aluminum alloy, magnesium-silver alloy, and rare earth metal such as indium, and ytterbium. These may be used independently, but preferably used in combination for realizing both stability and electron-injecting properties.

Among them, the alkali metal and alkaline earth metal are preferable in terms of their desirable electron-injecting properties, a material mainly formed of aluminum is particularly preferable in view of its excellent storage stability.

The material mainly formed of aluminum means aluminum alone, alloy of aluminum and 0.01% by mass to 10% by mass of alkali metal or alkaline earth metal, or a mixture thereof (e.g. lithium-aluminum alloy, magnesium-aluminum alloy, etc.).

The electrode can be formed in accordance with methods known in the art, without any restriction, and examples of the formation method thereof include: wet methods such as printing and coating; physical methods such as vacuum deposition, sputtering, and ion-plating; and chemical methods such as CVD, and plasma CVD. The electrode can be formed on the substrate by the method appropriately selected from the aforementioned methods considering the suitability to the material for forming the electrode. In the case where ITO is selected as a material of the anode, for example, the anode can be formed by direct current or high frequency sputtering, vacuum deposition, or ion-plating. In the case where metal and the like are selected as a material of the cathode, the cathode can be formed by sputtering one metal, or simultaneously or successively sputtering two or more metals.

In the case where patterning is performed to form the cathode, the patterning may be performed by chemical etching such as photolithography, or may be performed by physical etching such as using laser. Alternatively, the patterning may be performed by vacuum deposition or sputtering using a mask, or performed by a lift-off method, or a printing method.

<Substrate>

It is preferred that the organic electric field light-emitting element be provided on the substrate, where the organic electric field light-emitting element may be provided on the substrate so that the electrode and the substrate are directly in contact with each other, or via an intermediate layer.

The material of the substrate is suitably selected depending on the intended purpose without any restriction, and examples thereof include: inorganic materials such as yttria stabilized zirconia (YSZ), and glass (e.g. alkali-free glass and soda-lime glass); polyester such as polyethylene terephthalate, polybutylene phthalate, polyethylene naphthalate; and organic materials such as polystyrene, polycarbonate, polyether sulfone, polyallylate, polyimide, polycycloolefin, norbornene resin, and poly(chlorotrifluoroethylene).

The shape, structure, size, and the like of the substrate are suitably selected depending on the intended use and application of the resulting light emitting element, without any restriction. Generally, the shape of the substrate is preferably a plate shape. The structure of the substrate may be a single-layer structure or a laminate structure, and the substrate may be formed of a single member or formed of two or more members. The substrate may be clear or opaque, and in case of the clear substrate it may be colorless or colored.

To the substrate, a moisture barrier layer (a gas barrier layer) can be provided on its surface or back surface.

Examples of the material of the moisture barrier layer (the gas barrier layer) include inorganic materials such as silicon nitride and silicon oxide.

The moisture barrier layer (the gas barrier layer) can be formed, for example, by high frequency sputtering.

Other Structural Components—

Other structural components are suitably selected depending on the intended purpose without any restriction, and examples thereof include a protective layer, a sealing container, a resinous sealing layer, and a sealing adhesive.

The details of the protective layer, sealing container, resinous sealing layer, and sealing adhesive are suitably selected depending on the intended purpose without any restriction, and for example, the information described in JP-A No. 2009-152572 can be applied here.

FIG. 1 is a schematic diagram showing one example of the layer structure of the organic electric field light-emitting element of the present invention. The organic electric field light-emitting element 10 contains an anode 2 (e.g. ITO electrode), a hole-injecting layer 3, a hole-transporting layer 4, an organic layer 5, a first electron-transporting layer 6, a second electron-transporting layer 7, an electron-injecting layer (not shown), and a cathode 8 (e.g. Al—Li electrode) formed and laminated on a substrate 1 in this order. Note that, the anode 2 (e.g. ITO electrode) and the cathode 8 (e.g. Al—Li electrode) are electrically connected to each other through a power source.

—Driving—

Light can be emitted from the organic electric field light-emitting element of the present invention by applying a direct current (optionally containing an alternating current component) voltage (generally 2 V to 15 V) or direct current to between the anode and the cathode of the organic electric field light-emitting element.

The organic electric field light-emitting element of the present invention can be applied for an active matrix using a thin film transistor (TFT). As an active layer of the thin film transistor, amorphous silicon, high temperature polysilicon, low temperature polysilicon, microcrystal silicon, oxide semiconductor, organic semiconductor, carbon nanotubes and the like can be used.

The organic electric field light-emitting element of the present invention can be applied for the thin-film transistors described in International Patent Application Publication No. WO 2005/088726, JP-A No. 2006-165529, and US Patent Application Publication No. 2008/0237598.

The light extraction efficiency of the organic electric field light-emitting element of the present invention can be improved by various methods in the art. For example, it is possible to improve the light extraction efficiency and external quantum efficiency by processing a surface configuration of the substrate (e.g. forming a fine convex-concave pattern), controlling the reflective index of the substrate, ITO layer, and organic layer, controlling the thicknesses of the substrate, ITO layer, and organic layer, or the like.

The light-extraction system of the organic electric field light-emitting element of the present invention may be a top-emission system or a bottom-emission system.

The organic electric field light-emitting element of the present invention may have a resonance structure. For example, in the first embodiment, the organic electric field light-emitting element contains a multi-layer film mirror each layer of which has different refractive indexes, a transparent or translucent electrode, a light-emitting layer and a metal electrode laminated on a transparent substrate. The light emitted from the light-emitting layer is repetitively reflected between the multi-layer film mirror and the metal electrode using them as reflector to resonate.

In the second embodiment, the transparent or translucent electrode and the metal electrode are provided on a transparent substrate, and function as the reflectors. The light emitted from the light-emitting layer is repetitively reflected between the transparent or translucent electrode and the metal electrode to resonate.

In order to form a resonance structure, an optical path length determined by the effective refractive indexes of two reflectors, and reflective index and thickness of each layer provided between the reflectors is adjusted to have an optimal value to attain the desired resonance wavelength.

The calculation formula in the case of the first embodiment is described in JP-A No. 09-180883.

The calculation formula in the case of the second embodiment is described in JP-A No. 2004-127795.

—Use—

Use of the organic electric field light-emitting element of the present invention is suitably selected depending on the intended purpose without any restriction, but it is suitably used for a display element, a display, a back light, electrophotography, a illumination light source, a recording light source, an exposure light source, a reading light source, an indicator, a signboard, interior decoration, and optical communication.

As a method of making the organic electroluminescence display full color, for example, as described in Monthly Display, pp. 33-37 (September, 2000), the following methods are known: a three-color light-emitting method in which organic EL elements respectively emitting colors of light corresponding to three primary colors (blue (B), green (G) and red (R)) are arranged on a substrate; a white color method in which white color emission emitted from an organic EL element for white color emission is separated into three colors through a color filter; and a color-converting method in which blue color emission emitted from an organic EL element for blue color emission is converted into red (R) and green (G) through a fluorescent dye layer.

EXAMPLES

Examples of the present invention will be explained hereinafter, but these Examples shall not be construed as limiting to the scope of the present invention in any way.

<Preparation Method of Organic Electric Field Light-Emitting Element>

A glass substrate provided with an indium tin oxide (referred to as ITO hereinafter), in which ITO had been deposited to give a thickness of 100 nm on the glass substrate having a thickness of 0.5 mm and a side of 2.5 cm, was placed in a washing container, subjected to ultrasonic washing in 2-propanol, and thereafter subjected to UV-ozone treatment for 30 minutes to thereby prepare a transparent anode. Onto this transparent anode, an organic layer and metal layers of each Example were deposited using a vacuum deposition device. Note that, in the following Examples and Comparative Example, the vacuum deposition was carried out in the same conditions. The deposition speed was 0.2 nm/sec unless otherwise stated. The deposition speed was measured by means of a quartz resonator. The pressure was $1 \times 10^{-4}$ Pa.

During the formation of a layer by co-depositing two or more materials, the deposition speed of the compound having the smaller concentration in the resulting layer was controlled to have the desired concentration in the resulting layer.

A material whose concentration was changed within the light-emitting layer was deposited by adjusting and linearly changing the deposition speed of such material to obtain the desirable concentration distribution thereof in the light-emitting layer.

Example 1

Preparation of White Association Emission Light-Emitting Element

A glass substrate having a thickness of 0.5 mm and a side of 2.5 cm was placed in a washing container, and subjected to ultrasonic washing in a neutral detergent, and then subjected to ultrasonic washing in purified water. Thereafter, the glass substrate was subjected to heat treatment at 120° C. for 120 minutes, followed by subjected to UV-ozone treatment for 30 minutes. On this glass substrate, each layer was deposited by vacuum deposition. Note that, in the following Examples and Comparative Examples, the deposition speed was 0.2 nm/sec unless otherwise stated. The deposition speed was measured by a quartz resonator. Moreover, the thickness of each layer was measured by a quartz resonator.

At first, on the glass substrate, indium tin oxide (ITO) was deposited by sputtering to give a thickness of 100 nm to thereby form an anode.

Next, on the anode (ITO), 4,4',4"-tris(N,N-(2-naphthyl)-phenylamino)triphenylamine (2-TNATA) expressed by the following structural formula doped with 1% by mass of F4-TCNQ expressed by the following structural formula was deposited by vacuum deposition to give a thickness of 45 nm to thereby form a hole-injecting layer.

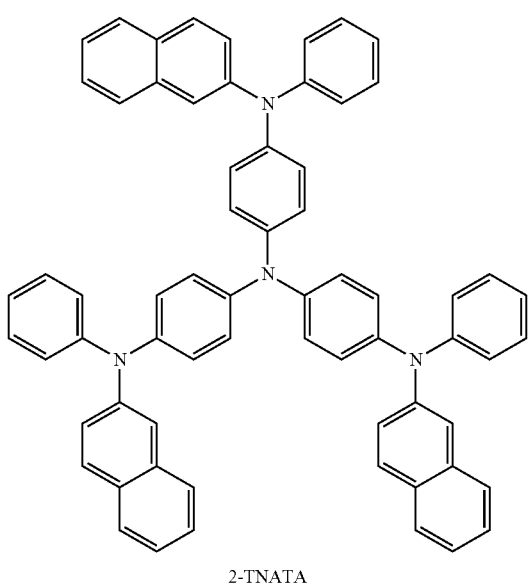

2-TNATA

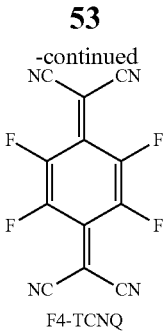

F4-TCNQ

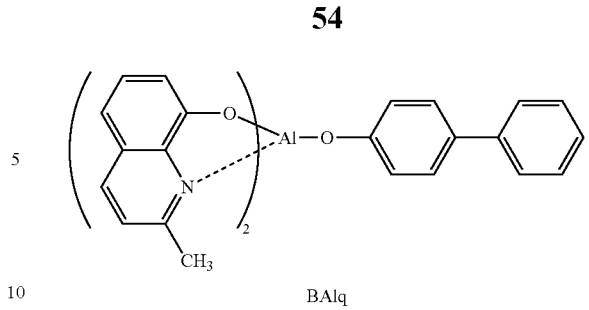

BAlq

Next, on the hole-injecting layer, bis[N-(1-naphthyl)-N-phenyl]benzidine (α-NPD) was deposited by vacuum deposition to give a thickness of 7 nm to thereby form a hole-transporting layer.

On the hole-transporting layer, Compound 1 expressed by the following structural formula was deposited by vacuum deposition to give a thickness of 3 nm to thereby form a second hole-transporting layer.

Compound 1

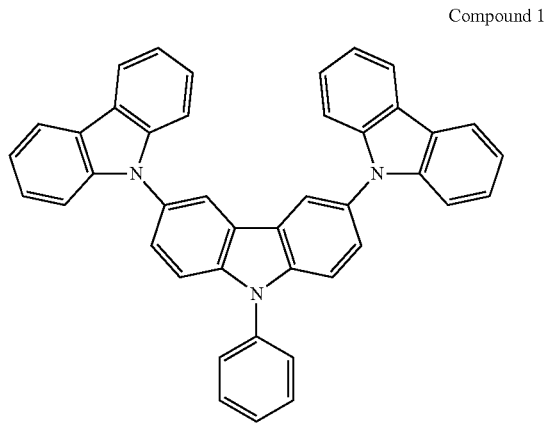

On the second hole-transporting layer, 1,3-bis(carbazol-9-yl)benzene (mCP) serving as a host material and Compound 2 expressed by the following structural formula were vacuum deposited to give a thickness of 30 nm, while continuously changing the doping amount of Compound 2 from 40% by mass (at the side of Compound 1) to 50% by mass (at the side of Balq) relative to the mCP, to thereby form a light-emitting layer.

Compound 2

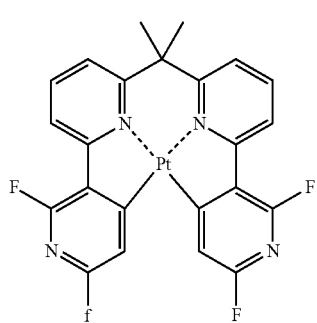

Next, on the light-emitting layer, bis-(2-methyl-8-quinolinolato)-4-(phenyl-phenolate)-aluminium (III) (Balq) was deposited by vacuum deposition to give a thickness of 39 nm to thereby form a first electron-transporting layer.

On the first electron-transporting layer, 2,9-dimethyl-4,7-diphenyl-1,10-phenanthroline (BCP) was deposited by vacuum deposition to give a thickness of 1 nm to thereby form a second electron-transporting layer.

Next, on the electron-injecting layer, a patterned mask (a mask to give an emission region in the size of 2 mm×2 mm) was placed, and a metal aluminum was deposited by vacuum deposition through the mask to give a thickness of 100 nm to thereby form a cathode.

The prepared laminate was placed in a glove box whose inner atmosphere had been replaced with nitrogen gas, the laminate was sealed using a glass sealing structure and a UV-curable adhesive (XNR5516HV, manufactured by Nagase ChemteX Corporation). In the manner mentioned above, an organic electric field light-emitting element of Example 1 was prepared.

The layer structure of the organic electric field light-emitting element of Example 1 was as presented below. Note that, the values given in the brackets indicate the thickness of each layer.

<ITO (100 nm)/2-TNATA+1% by mass of F4-TCNQ (45 nm)/NPD (7 nm)/Compound 1 (3 nm)/mCP+XX % by mass of Compound 2 (30 nm)/Balq (39 nm)/BCP (1 nm)/LiF (0.5 nm)/Al (100 nm)>

Comparative Example 1

An organic electric field light-emitting element of Comparative Example 1 was prepared in the same manner as in Example 1, provided mCP serving as the host material was doped with 40% by mass of Compound 2 expressed by the above structural formula serving as a phosphorescent material.

The layer structure of the organic electric field light-emitting element of Comparative Example 1 was as presented below. Note that, the values given in the brackets indicate the thickness of each layer.

<ITO (100 nm)/2-TNATA+1% by mass of F4-TCNQ (45 nm)/NPD (7 nm)/Compound 1 (3 nm)/mCP+40% by mass of Compound 2 (30 nm)/Balq (39 nm)/BCP (1 nm)/LiF (0.5 nm)/Al (100 nm)>

The prepared organic electric field light-emitting elements of Example 1 and Comparative Example 1 were evaluated in terms of integral spectrum intensity C of the monomer, integral spectrum intensity D of the association, external quantum efficiency, permanence (relative luminance half-life), CIEx, CIEy, and chromaticity change (ΔE) in the following manners. The results are shown in Tables 1-1 and 1-2.

<Measurement of Integral Spectrum Intensity C of Monomer and Integral Spectrum Intensity D of Association>

Figure 2:
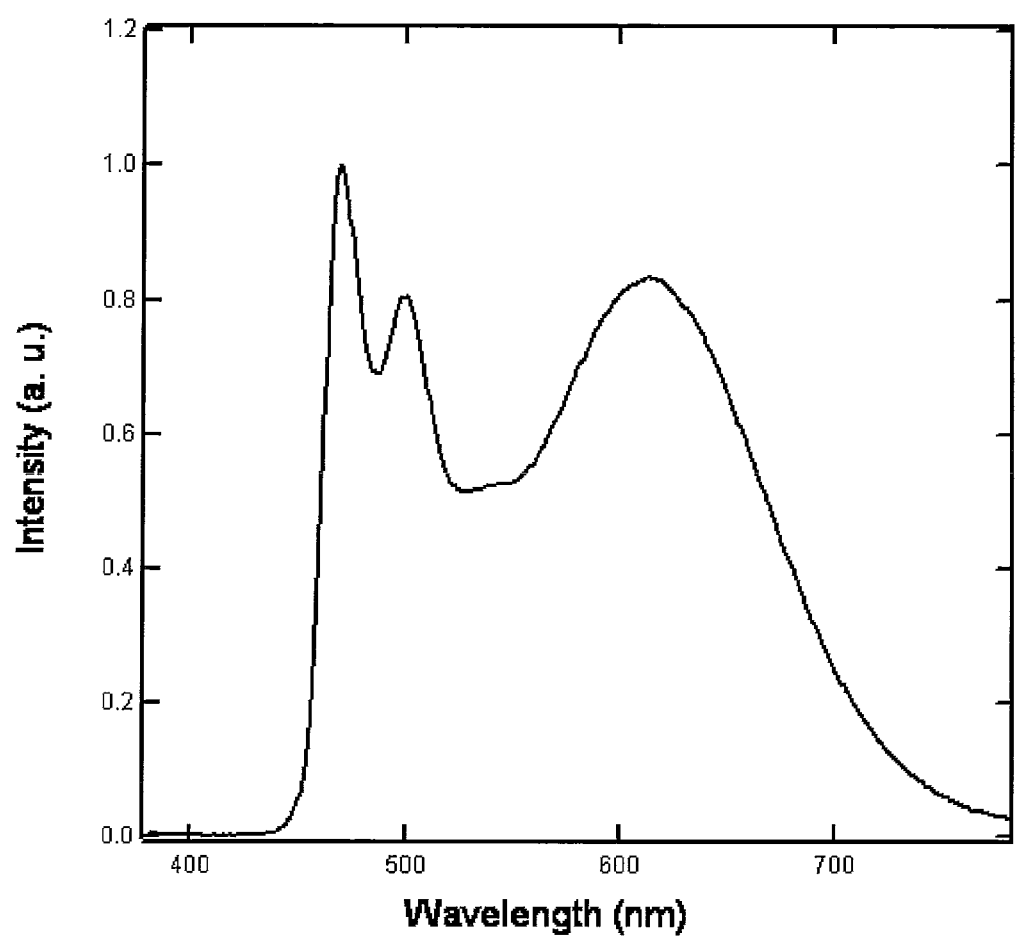
FIG. 2 is a diagram showing the emission spectrum of Example 1.
Figure 3:
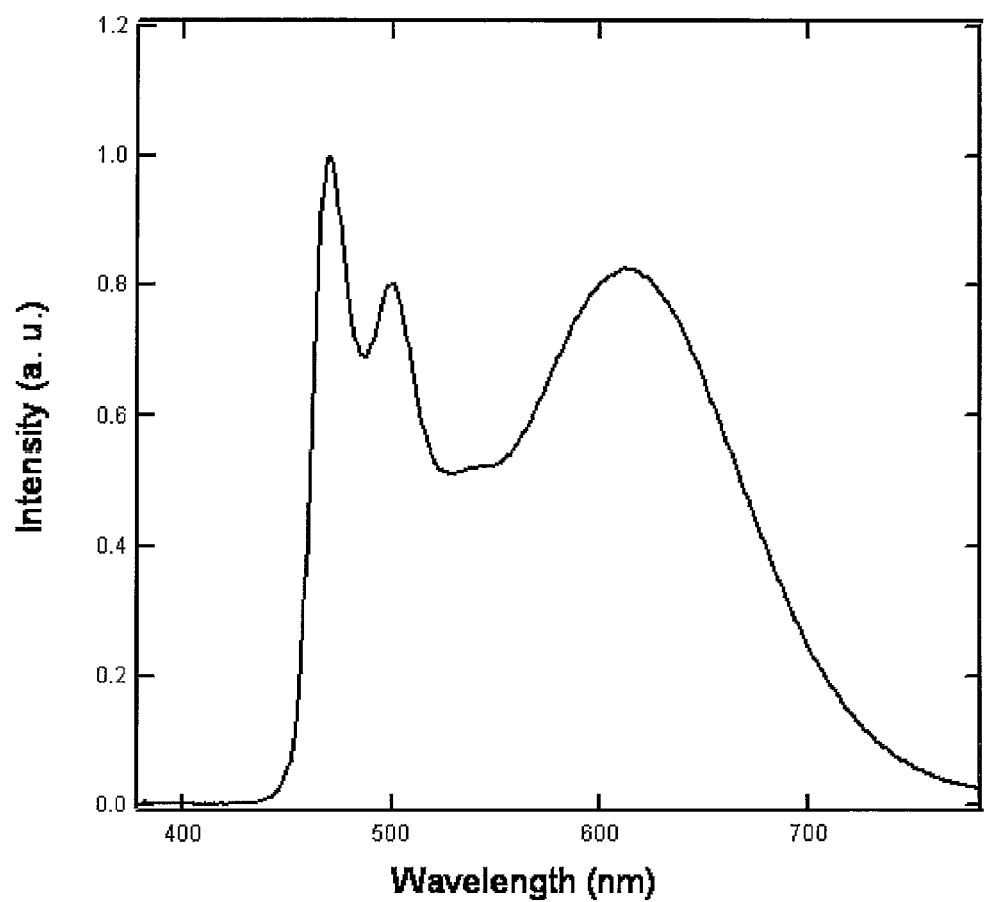
FIG. 3 is a diagram showing the emission spectrum of Comparative Example 1.

The prepared organic electric field light-emitting element was made emit by applying direct current using a source measure unit 2400 manufactured by TOYO Corporation. A spectrum of this emission was measured by means of a spectral radiance meter SR-3, manufactured by Topcon Corporation. The obtained emission spectrum was subjected to fitting by a method of least square using the spectrum of the monomer and the emission spectrum of the association to thereby calculate the integral spectrum intensity C of the monomer and the integral spectrum intensity D of the association. The emission spectrum of the organic electric field light-emitting element of Example 1 at the time when the current was applied at 0.25 mA/cm$^2$ is shown in FIG. 2, and that of Comparative Example 1 is shown in FIG. 3.

<External Quantum Efficiency>

The external quantum efficiency of each organic electric field light-emitting element to which the current was applied at the current density of 0.25 mA/cm$^2$ was calculated by the intensity conversion of each wavelength.

<Permanence>

The permanence of each organic electric field light-emitting element was evaluated by measuring a luminance half-life of the element at the constant current of 1,000 cd/m$^2$, and obtaining a relative luminance half-life of the element relative to the element of Comparative Example 1, based on the measured luminance half-life.

<Evaluation of Color Difference>

Each organic electric field light-emitting element was made emit by applying direct current using a source measure unit 2400 manufactured by TOYO Corporation. A spectrum of this emission was measured by means of a spectral radiance meter SR-3, manufactured by Topcon Corporation. Based on the obtained emission spectrum, the CIE color coordinate values (x, y) of the emission at the current density of 0.25 mA/cm$^2$ and the emission at the current density of 25 mA/cm$^2$ were measured by converting the values of the spectrum. Moreover, the color difference (ΔE) in Lab color space was obtained by converting the color coordinate values.

Example 2

Preparation of White Emission Single Layer Light-Emitting Element

A organic electric field light-emitting element of Example 2 was prepared in the same manner as in Example 1, provided that mCP was doped with 15% by mass of Compound 3 expressed by the following structural formula, 0.13% by mass of Compound 4 expressed by the following structural formula, and Compound 5 where the doping amount of Compound 5 was continuously changed from 0.13% by mass (at the side of Compound 1) to 0.2% by mass (at the side of Balq), all relative to the amount of mCP.

Compound 3

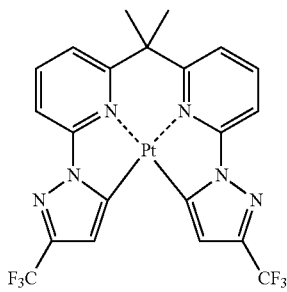

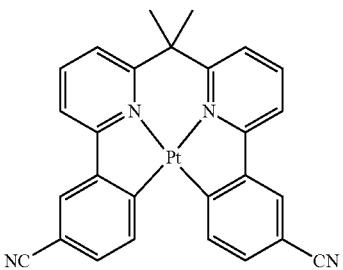

Compound 4

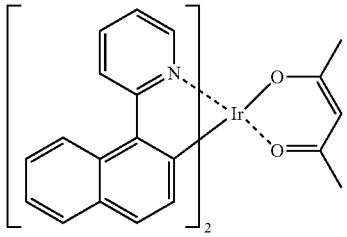

Compound 5

The layer structure of the organic electric field light-emitting element of Example 2 was as presented below. Note that, the values given in the brackets indicate the thickness of each layer.

<ITO (100 nm)/2-TNATA+1% by mass of F4-TCNQ (45 nm)/NPD (7 nm)/Compound 1 (3 nm)/mCP+xx % by mass of Compound 3+% by mass of Compound 4+zz % by mass of Compound 5 (30 nm)/Balq (39 nm)/BCP (1 nm)/LiF (0.5 nm)/Al (100 nm)>

Comparative Example 2

An organic electric field light-emitting element of Comparative Example 2 was prepared in the same manner as in Example 1, provided that mCP was doped with 15% by mass of Compound 3 expressed by the structural formula above, 0.13% by mass of Compound 4 expressed by the structural formula above, and 0.13% by mass of Compound 5 expressed by the structural formula above, all relative to the amount of mCP.

The layer structure of the organic electric field light-emitting element of Comparative Example 2 was as presented below. Note that, the values given in the brackets indicate the thickness of each layer.

<ITO (100 nm)/2-TNATA+1% by mass of F4-TCNQ (45 nm)/NPD (7 nm)/Compound 1 (3 nm)/mCP+15% by mass of Compound 3+0.13% by mass of Compound 4+0.13% by mass of Compound 5 (30 nm)/Balq (39 nm)/BCP (1 nm)/LiF (0.5 nm)/Al (100 nm)>

Figure 4:
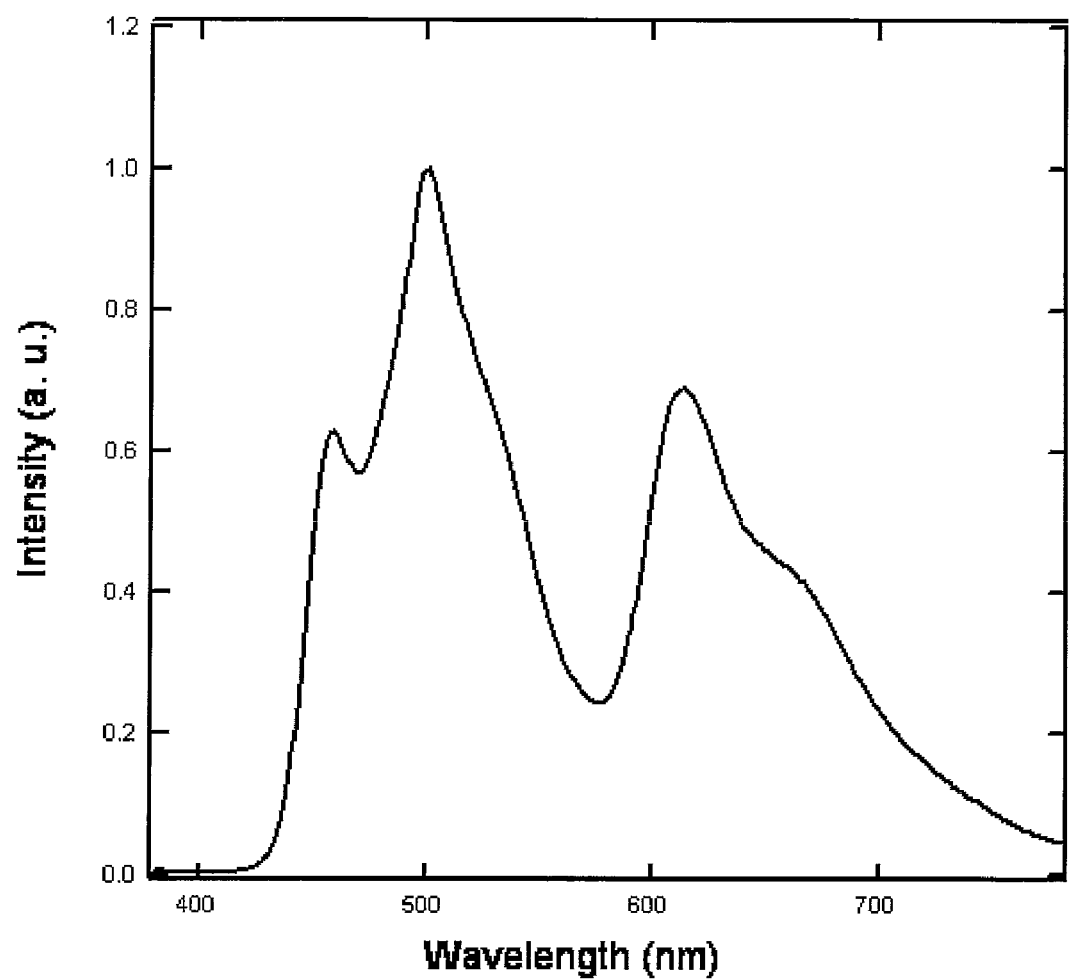
FIG. 4 is a diagram showing the emission spectrum of Example 2.
Figure 5:
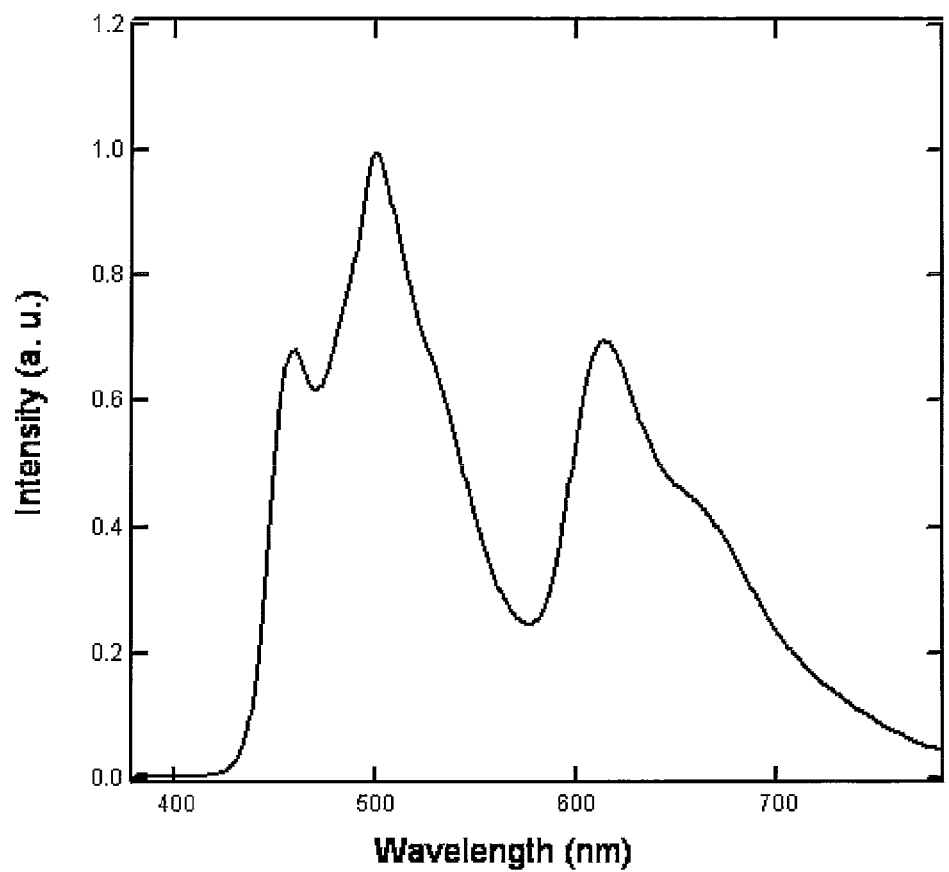
FIG. 5 is a diagram showing the emission spectrum of Comparative Example 2.

Next, the prepared organic electric field light-emitting elements of Example 2 and Comparative Example 2 were subjected to the measurements of the concentration A of the luminescent material having the shortest emission peak, and the concentration B of the luminescent material having the longest emission peak, in the following manner. Moreover, the elements of Example 2 and Comparative Example 2 were evaluated in terms of external quantum efficiency, permanence (relative luminance half-life), CIEx, CIEy, and color difference (ΔE) in the same manner as in Example 1 and Comparative Example 1. The results are shown in Tables 1-1 and 1-2. The emission spectrum of the organic electric field light-emitting element of Example 2 measured in the same manner as in Example 1 and Comparative Example 1 is shown in FIG. 4, and that of Comparative Example 2 is shown in FIG. 5.

<Measurement of Concentration A of Luminescent Material having Shortest Emission peak and Concentration B of Luminescent Material having Longest Emission Peak>

The concentration A of the luminescent material having the shortest emission peak and the concentration B of the luminescent material having the longest emission peak were respectively measured based on the values of the quartz resonator at the time of the deposition.

Example 3

Preparation of White Emission Single Layer Light-Emitting Element

An organic electric field light-emitting element of Example 3 was prepared in the same manner as in Example 1, provided that mCP was doped with Compound 3 expressed by the structural formula above where the doping amount thereof was continuously changed from 15% by mass (at the side of Compound 1) to 13% by mass (at the side of Balq), 0.13% by mass of Compound 4 expressed by the structural formula above, and 0.13% by mass of Compound 5 expressed by the structural formula above, all relative to the amount of mCP.

The layer structure of the organic electric field light-emitting element of Example 3 was as presented below. Note that, the values given in the brackets indicate the thickness of each layer.
<ITO (100 nm)/2-TNATA+1% by mass of F4-TCNQ (45 nm)/NPD (7 nm)/Compound 1 (3 nm)/mCP+xx % by mass of Compound 3+yy % by mass of Compound 4+zz % by mass of Compound 5 (30 nm)/Balq (39 nm)/BCP (1 nm)/LiF (0.5 nm)/Al (100 nm)>

Comparative Example 3

The organic electric field light-emitting element identical to that of Comparative Example 2 was used as an organic electric field light-emitting element of Comparative Example 3.

Figure 6:
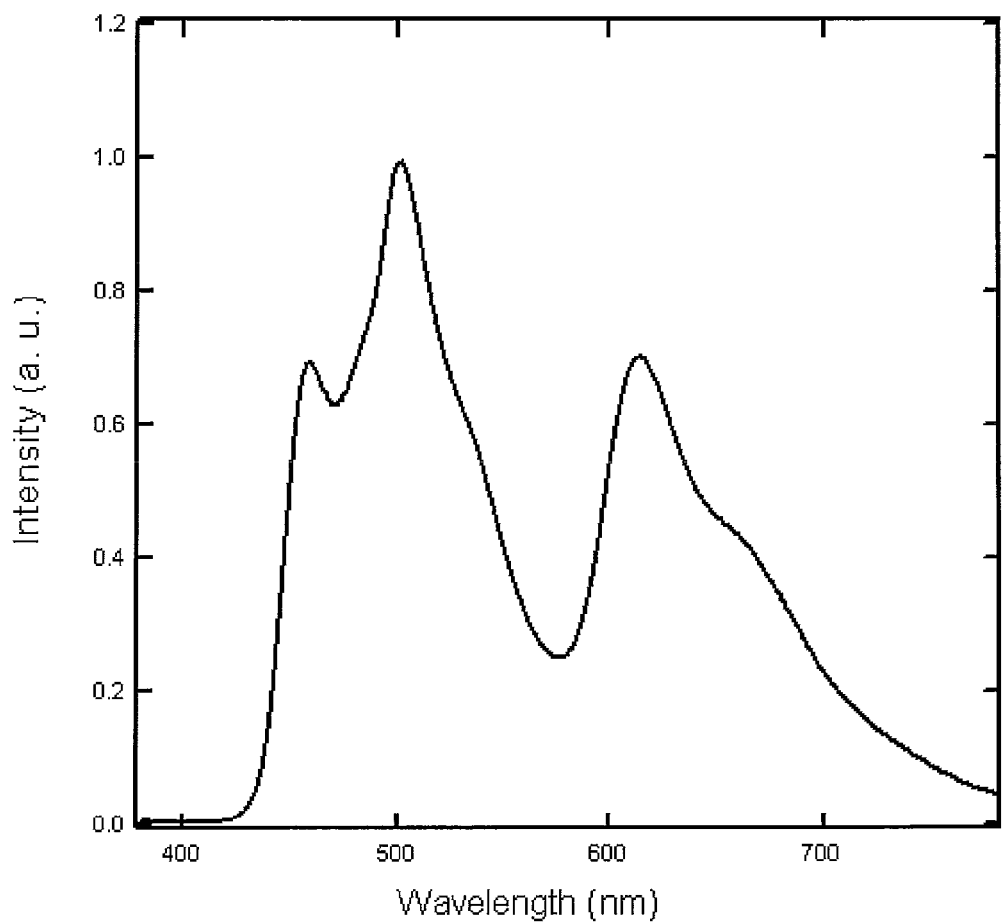
FIG. 6 is a diagram showing the emission spectrum of Example 3.

Next, the prepared organic electric field light-emitting elements of Example 3 and Comparative Example 3 were evaluated in the same manner as in Example 2 and Comparative Example 2, in terms of the concentration A of the luminescent material having the shortest emission peak, the concentration B of the luminescent material having the longest emission peak, external quantum efficiency, permanence (relative luminance half-life), CIEx, CIEy, and color difference (ΔE) The results are shown in Tables 1-1 and 1-2. The emission spectrum of the element of Example 3 measured in the same manner as in Example 1 and Comparative Example 1 is shown in FIG. 6. The emission spectrum of the element of Comparative Example 3 is the same as the emission spectrum shown in FIG. 5.

Example 4

Preparation of White Emission Single Layer Light-Emitting Element

An organic electric field light-emitting element of Example 4 was prepared in the same manner as in Example 1, provided that mCP was doped with Compound 3 where the doping amount of Compound 3 expressed by the structural formula above was continuously changed from 15% by mass (at the side of Compound 1) to 14% by mass (at the side of Balq), 0.13% by mass of Compound 4 expressed by the structural formula above, and Compound 5 expressed by the structural formula above where the doping amount of Compound 5 was continuously changed from 0.13% by mass (at the side of Compound 1) to 0.18% by mass (at the side of Balq), all relative to the mCP.

The layer structure of the organic electric field light-emitting element of Example 4 was as presented below. Note that, the values given in the brackets indicate the thickness of each layer.
<ITO (100 nm)/2-TNATA+1% by mass of F4-TCNQ (45 nm)/NPD (7 nm)/Compound 1 (3 nm)/mCP+xx % by mass of Compound 3+yy % by mass of Compound 4+zz % by mass of Compound 5 (30 nm)/Balq (39 nm)/BCP (1 nm)/LiF (0.5 nm)/Al (100 nm)>

Comparative Example 4

The organic electric field light-emitting element same as that of Comparative Example 2 was used as an organic electric field light-emitting element of Comparative Example 4.

Figure 7:
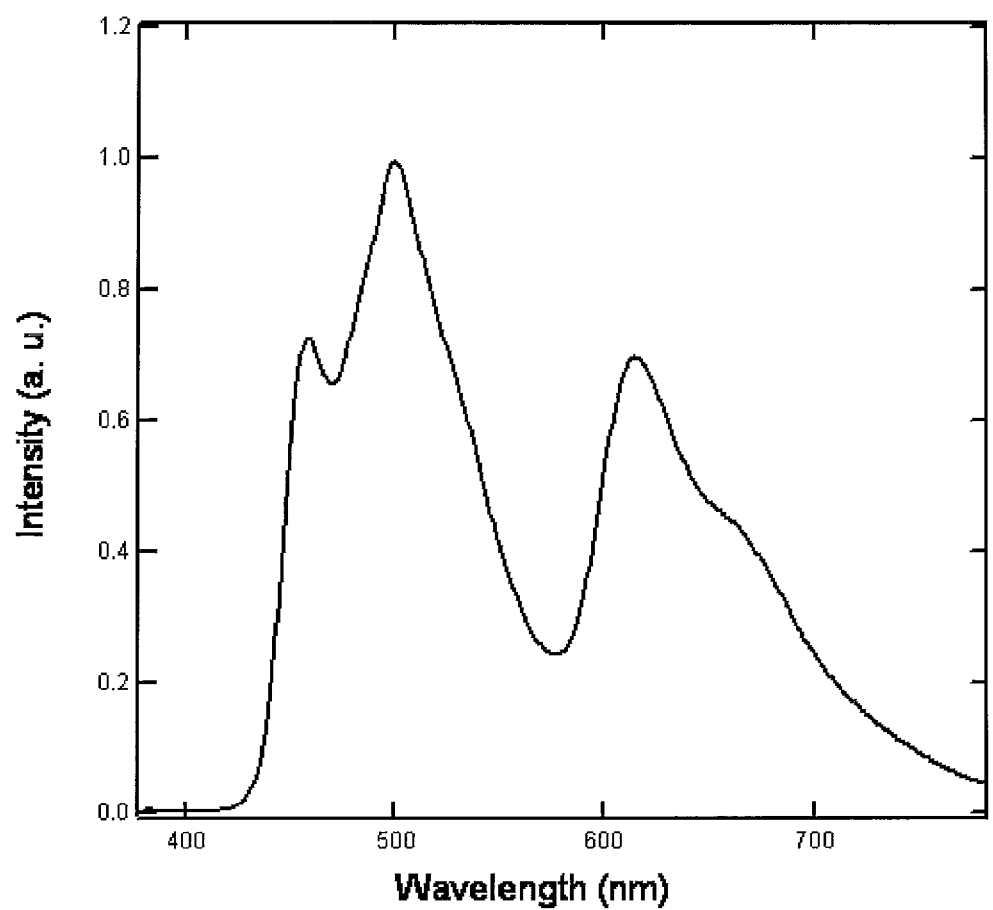
FIG. 7 is a diagram showing the emission spectrum of Example 4.

Next, the prepared organic electric field light-emitting elements of Example 4 and Comparative Example 4 were evaluated in the same manner as in Example 2 and Comparative Example 2, in terms of the concentration A of the luminescent material having the shortest emission peak, the concentration B of the luminescent material having the longest emission peak, external quantum efficiency, permanence (relative luminance half-life), CIEx, CIEy, and color difference (ΔE). The results are shown in Tables 1-1 and 1-2. The emission spectrum of the element of Example 4 measured in the same manner as in Example 1 and Comparative Example 1 is shown in FIG. 7. The emission spectrum of the element of Comparative Example 4 is the same as the emission spectrum shown in FIG. 5.

Example 5

Preparation of Iridium-Based Single Layer Light-Emitting Element

A glass substrate having a thickness of 0.5 mm and a side of 2.5 cm was placed in a washing container, and subjected to ultrasonic washing in a neutral detergent, and then subjected to ultrasonic washing in purified water. Thereafter, the glass substrate was subjected to heat treatment at 120° C. for 120 minutes, followed by subjected to UV-ozone treatment for 30 minutes. On this glass substrate, each layer was deposited by vacuum deposition. Note that, in the following Examples and Comparative Examples, the deposition speed was 0.2 nm/sec unless otherwise stated. The deposition speed was measured by a quartz resonator. Moreover, the thickness of each layer was measured by a quartz resonator.

At first, indium tin oxide (ITO) was deposited as an anode on the glass substrate to give a thickness of 100 nm.

On the anode (ITO), 4,4',4"-tris(N,N-(2-naphthyl)-phenylamino)triphenylamine (2-TNATA) expressed by the structural formula above doped with 1% by mass of F4-TCNQ expressed by the structural formula above was deposited by vacuum deposition to give a thickness of 160 nm to thereby form a hole-injecting layer.

On the hole-injecting layer, bis[N-(1-naphthyl)-N-phenyl]benzidine (α-NPD) was deposited by vacuum deposition to give a thickness of 10 nm to thereby form a hole-transporting layer.

Then, on the hole-transporting layer, Compound 11 serving as a host material and expressed by the following structural formula, doped with 10% by mass of Compound 6 expressed by the following structural formula, 0.10% by mass of Compound 7 expressed by the following structural formula and Compound 8 where the amount thereof was continuously changed from 0.10% by mass (at NPD side) to 0.16% by mass (at Balq side), all relative to the amount of Compound 11, was deposited by vacuum deposition to give a thickness of 30 nm to thereby form a light-emitting layer.

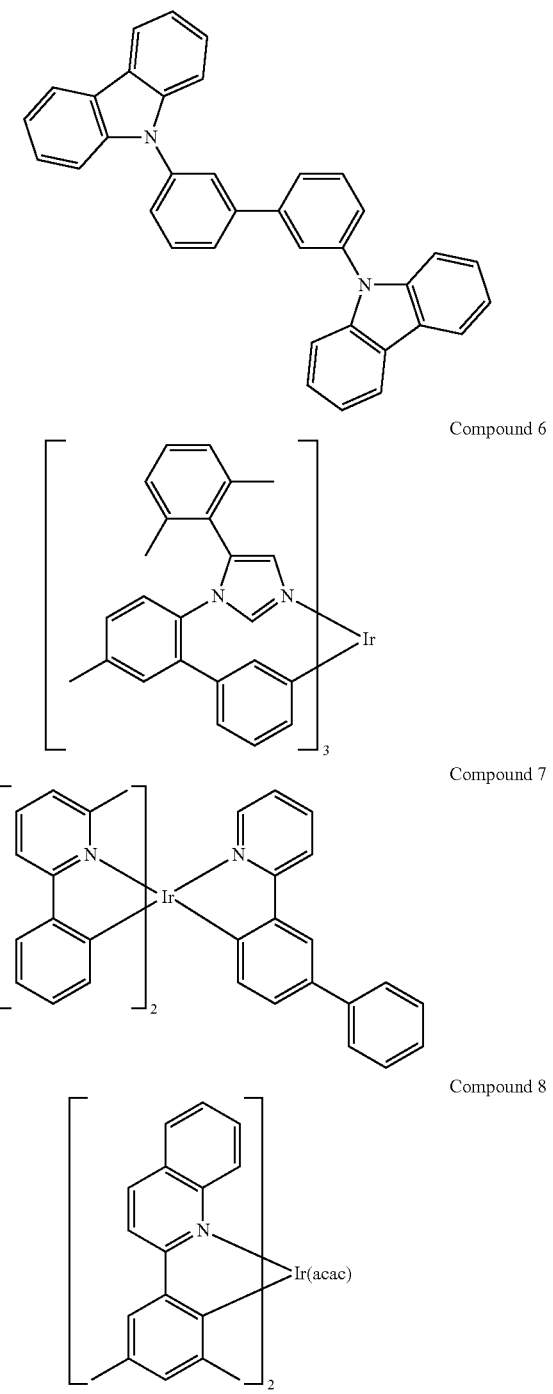

Compound 11

Compound 6

Compound 7

Compound 8

On the light-emitting layer, Balq was deposited by vacuum deposition to give a thickness of 39 nm to thereby form a first electron-transporting layer.

Next, on the first electron-transporting layer, 2,9-dimethyl-4,7-diphenyl-1,10-phenanthroline (BCP) was deposited to give a thickness of 1 nm to thereby form a second electron-transporting layer.

On the second electron-transporting layer, LiF was deposited by vacuum deposition to give a thickness of 1 nm to thereby form an electron-injecting layer.

Next, on the electron-injecting layer, a patterned mask (a mask to give an emission region in the size of 2 mm×2 mm) was placed, and a metal aluminum was deposited by vacuum deposition through the mask to give a thickness of 100 nm to thereby form a cathode.

The prepared laminate was placed in a glove box whose inner atmosphere had been replaced with nitrogen gas, the laminate was sealed using a glass sealing structure and a UV-curable adhesive (XNR5516HV, manufactured by Nagase ChemteX Corporation). In the manner mentioned above, an organic electric field light-emitting element of Example 5 was prepared.

The layer structure of the organic electric field light-emitting element of Example 5 was as presented below. Note that, the values given in the brackets indicate the thickness of each layer.

<ITO (100 nm)/2-TNATA+1% by mass of F4-TCNQ (160 nm)/NPD (10 nm)/Compound 11+xx % by mass of Compound 6+yy % by mass of Compound 7+zz % by mass of Compound 8 (30 nm)/Balq (39 nm)/BCP (1 nm)/LiF (1 nm)/Al (100 nm)>

Comparative Example 5

An organic electric field light-emitting element of Comparative Example 5 was prepared in the same manner as in Example 5, provided that Compound 11 serving as a host material and expressed by the structural formula above was doped with 10% by mass of Compound 6 expressed by the structural formula above, 0.10% by mass of Compound 7 expressed by the structural formula above, and 0.10% by mass of Compound 8, relative to the amount of Compound 11.

The layer structure of the organic electric field light-emitting element of Comparative Example 5 was as presented below. Note that, the values given in the brackets indicate the thickness of each layer.

<ITO (100 nm)/2-TNATA+1% by mass of F4-TCNQ (160 nm)/NPD (10 nm)/Compound 11+10% by mass of Compound 6+0.10% by mass of Compound 7+0.10% by mass of Compound 8 (30 nm)/Balq (39 nm)/BCP (1 nm)/LiF (1 nm)/Al (100 nm)>

Figure 8:
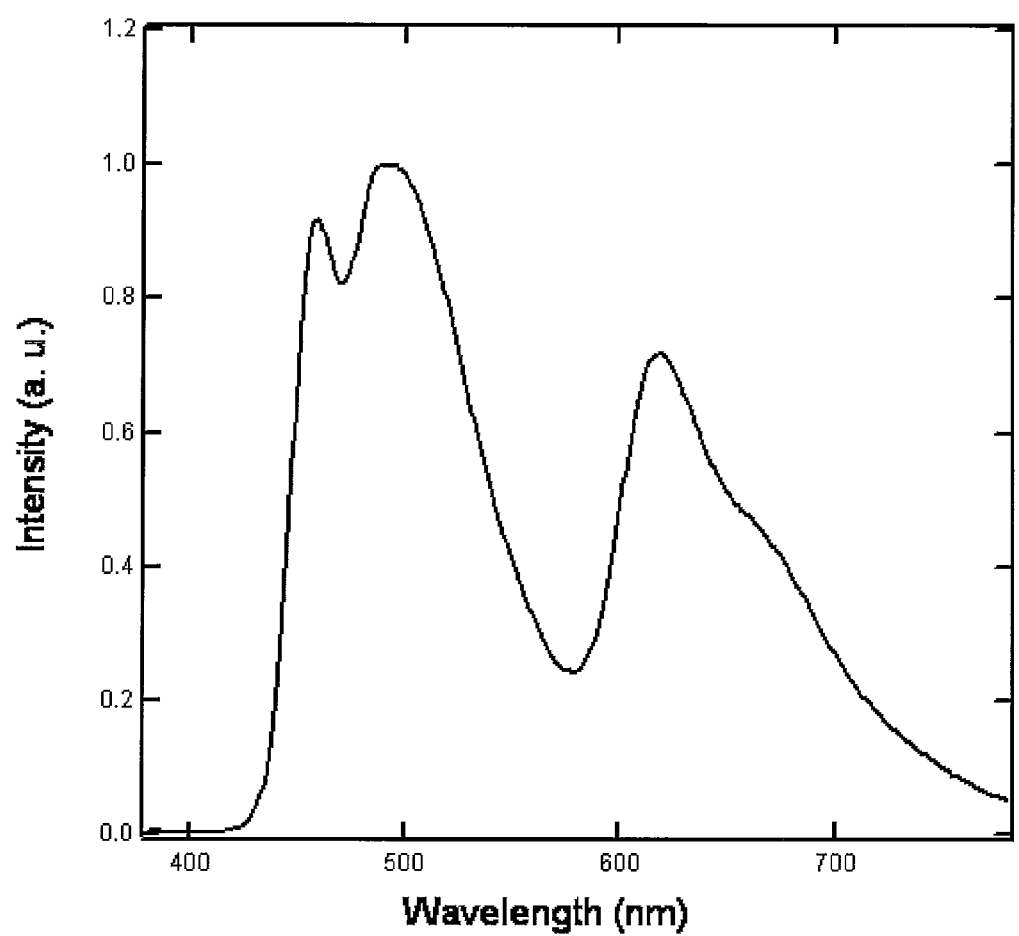
FIG. 8 is a diagram showing the emission spectrum of Example 5.
Figure 9:
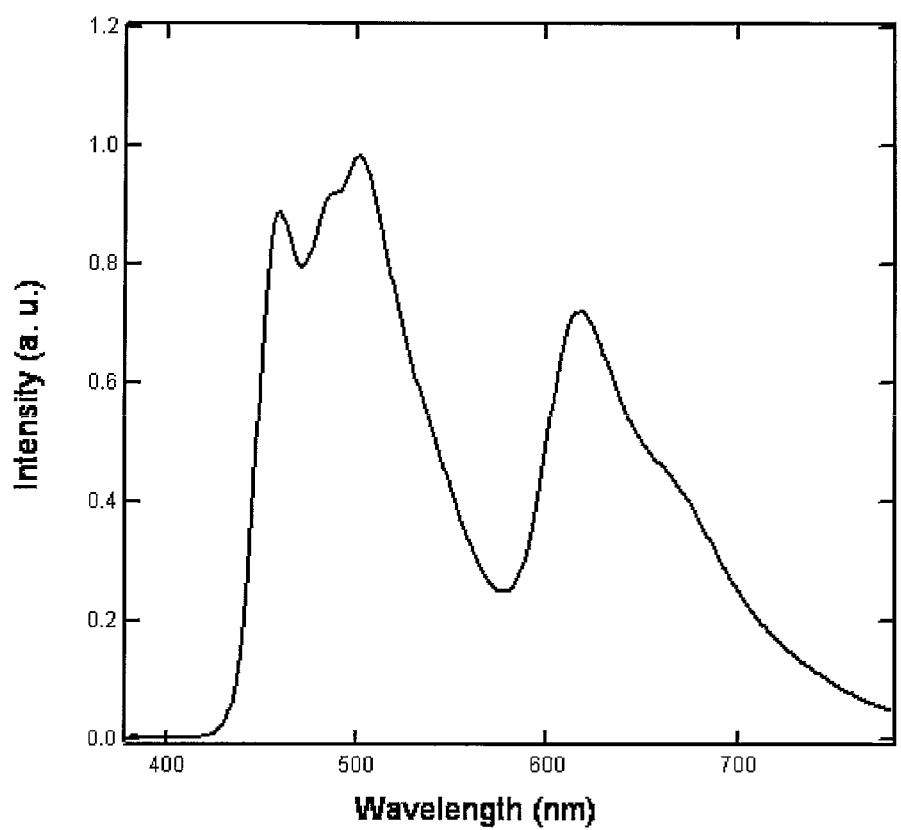
FIG. 9 is a diagram showing the emission spectrum of Comparative Example 5.

Next, the prepared organic electric field light-emitting elements of Example 5 and Comparative Example 5 were evaluated in the same manner as in Example 2 and Comparative Example 2, in terms of the concentration A of the luminescent material having the shortest emission peak, the concentration B of the luminescent material having the longest emission peak, external quantum efficiency, permanence (relative luminance half-life), CIEx, CIEy, and color difference (ΔE). The results are shown in Tables 1-1 and 1-2. The emission spectrum of the element of Example 5 measured in the same manner as in Example 1 and Comparative Example 1 is shown in FIG. 8, and that of Comparative Example 5 is shown in FIG. 9.

Example 6

An organic electric field light-emitting element of Example 6 was prepared in the same manner as in Example 5, provided that Compound 11 serving as a host is material and expressed by the structural formula above was doped with 10% by mass of Compound 9 expressed by the following structural formula, 0.10% by mass of Compound 10 expressed by the following structural formula, and Compound 5 expressed by the structural formula above where the amount of Compound 5 was continuously changed from 0.10% by mass (at NPD side) to 0.16% by mass (at Balq side), all relative to the amount of Compound 11.

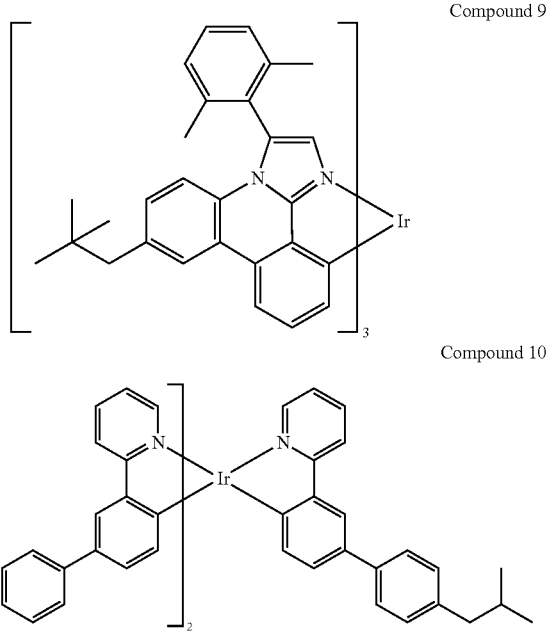

Comparative Example 6

An organic electric field light-emitting element of Comparative Example 6 was prepared in the same manner as in Example 6, provided that Compound 11 serving as a host material and expressed by the structural formula above was doped with 10% by mass of Compound 9, 0.10% by mass of Compound 10 expressed by the structural formula above, and 0.10% by mass of Compound 5 expressed by the structural formula above, all relative to the amount of Compound 11.

Figure 10:
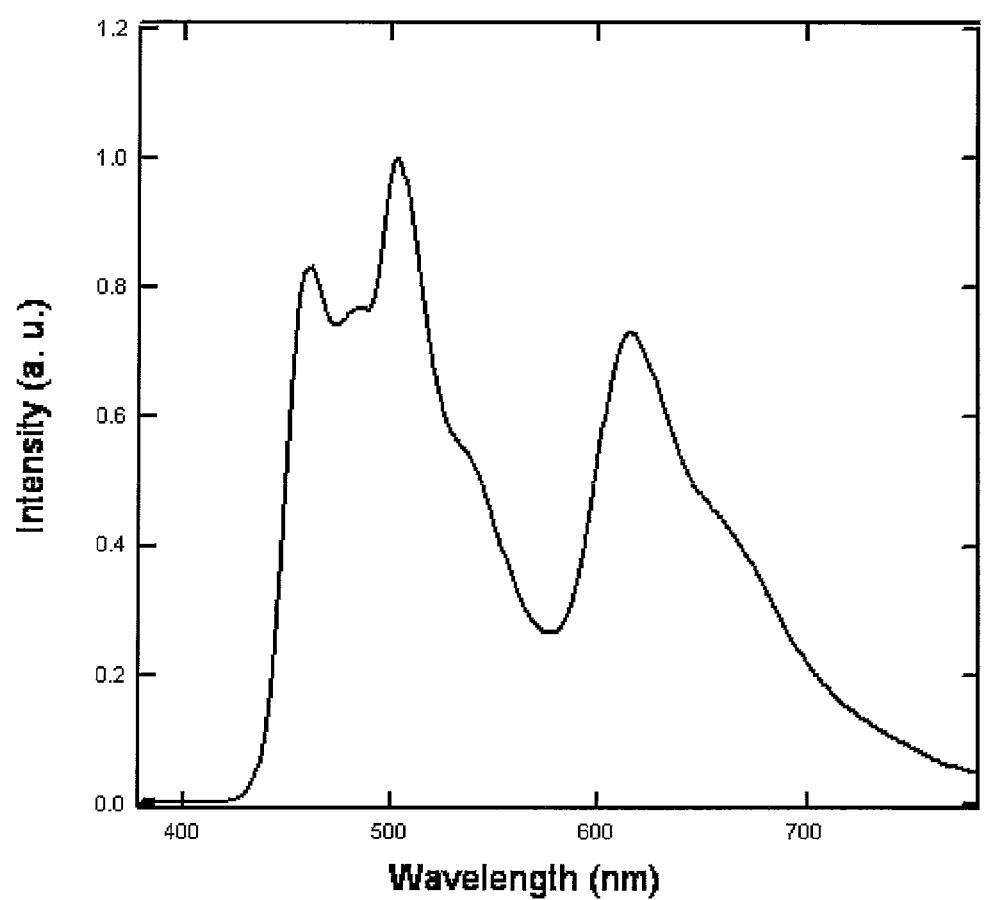
FIG. 10 is a diagram showing the emission spectrum of Example 6.
Figure 11:
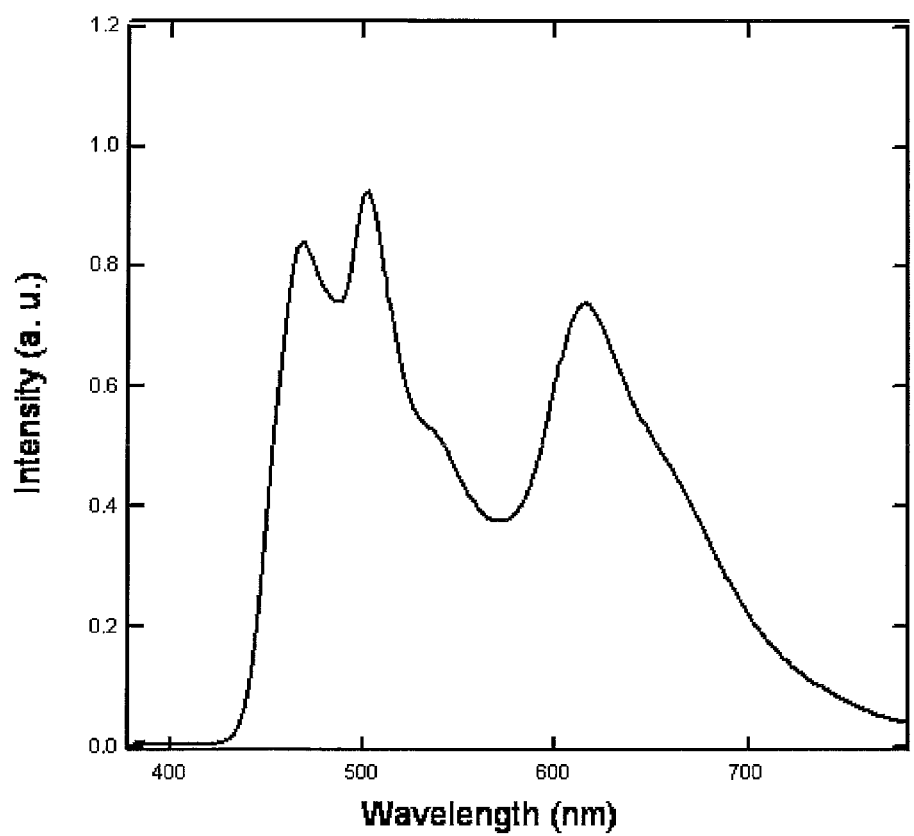
FIG. 11 is a diagram showing the emission spectrum of Comparative Example 6.

Next, the prepared organic electric field light-emitting elements of Example 6 and Comparative Example 6 were evaluated in the same manner as in Example 2 and Comparative Example 2, in terms of the concentration A of the luminescent material having the shortest emission peak, the concentration B of the luminescent material having the longest emission peak, external quantum efficiency, permanence (relative luminance half-life), CIEx, CIEy, and color difference (ΔE). The results are shown in Tables 1-1 and 1-2. The emission spectrum of the element of Example 6 measured in the same manner as in Example 1 and Comparative Example 1 is shown in FIG. 10, and that of Comparative Example 6 is shown in FIG. 11.

Example 7

A glass substrate having a thickness of 0.5 mm and a side of 2.5 cm was placed in a washing container, and subjected to ultrasonic washing in a neutral detergent, and then subjected to ultrasonic washing in purified water. Thereafter, the glass substrate was subjected to heat treatment at 120° C. for 120 minutes, followed by subjected to UV-ozone treatment for 30 minutes. On this glass substrate, each layer was deposited by vacuum deposition. Note that, in the following Examples and Comparative Examples, the deposition speed was 0.2 nm/sec unless otherwise stated. The deposition speed was measured by a quartz resonator. Moreover, the thickness of each layer was measured by a quartz resonator.

At first, indium tin oxide (ITO) was deposited as an anode on the glass substrate to give a thickness of 100 nm.

On the anode (ITO), 4,4',4''-tris(N,N-(2-naphthyl)-phenylamino)triphenylamine (2-TNATA) expressed by the structural formula above doped with 1% by mass of F4-TCNQ expressed by the structural formula above was deposited by vacuum deposition to give a thickness of 45 nm to thereby form a hole-injecting layer.

On the hole-injecting layer, bis[N-(1-naphthyl)-N-phenyl]benzidine (α-NPD) was deposited by vacuum deposition to give a thickness of 7 nm to thereby form a hole-transporting layer.

On the hole-transporting layer, Compound 1 expressed by the structural formula above was deposited by vacuum deposition to give a thickness of 3 nm to thereby form a second hole-transporting layer.

On the second hole-transporting layer, 1,3-bis(carbazol-9-yl)benzene (mCP) serving as a host material, deposed with Compound 2 serving as a phosphorescent material and expressed by the structural formula above, where the amount of Compound 2 was continuously changed from 40% by mass (at Compound 1 side) to 50% by mass (at Balq side) was deposited by vacuum deposition to give a thickness of 30 nm to thereby form a light-emitting layer.

On the light-emitting layer, Balq was deposited by vacuum deposition to give a thickness of 10 nm to thereby form a first electron-transporting layer.

On the first electron-transporting layer, 2,9-dimethyl-4,7-diphenyl-1,10-phenanthroline (BCP) doped with 1% by mass of Li was deposited by vacuum deposition to give a thickness of 230 nm to thereby form a second electron-transporting layer.

Next, on the electron-injecting layer, a patterned mask (a mask to give an emission region in the size of 2 mm×2 mm) was placed, and a metal aluminum was deposited by vacuum deposition through the mask to give a thickness of 100 nm to thereby form a cathode.

The prepared laminate was placed in a glove box whose inner atmosphere had been replaced with nitrogen gas, the laminate was sealed using a glass sealing structure and a UV-curable adhesive (XNR5516HV, manufactured by Nagase ChemteX Corporation). In the manner mentioned above, an organic electric field light-emitting element of Example 7 was prepared.

The layer structure of the organic electric field light-emitting element of Example 7 was as presented below. Note that, the values given in the brackets indicate the thickness of each layer.

<ITO (100 nm)/2-TNATA+1% by mass of F4-TCNQ (45 nm)/NPD (7 nm)/Compound 1 (3 nm)/mCP+XX % by mass of Compound 2 (30 nm)/Balq (10 nm)/BCP+1% by mass of Li (230 nm)/Al (100 nm)>

Comparative Example 7

An organic electric field light-emitting element of Comparative Example 7 was prepared in the same manner as in Example 7, provided that mCP was doped with 40% by mass of Compound 2 expressed by the structural formula above.

The layer structure of the organic electric field light-emitting element of Comparative Example 7 was as presented below. Note that, the values given in the brackets indicate the thickness of each layer.

<ITO (100 nm)/2-TNATA+1% by mass of F4-TCNQ (45 nm)/NPD (7 nm)/Compound 1 (3 nm)/mCP+40% by mass of Compound 2 (30 nm)/Balq (10 nm)/BCP+1% by mass of Li (230 nm)/Al (100 nm)>

Figure 12:
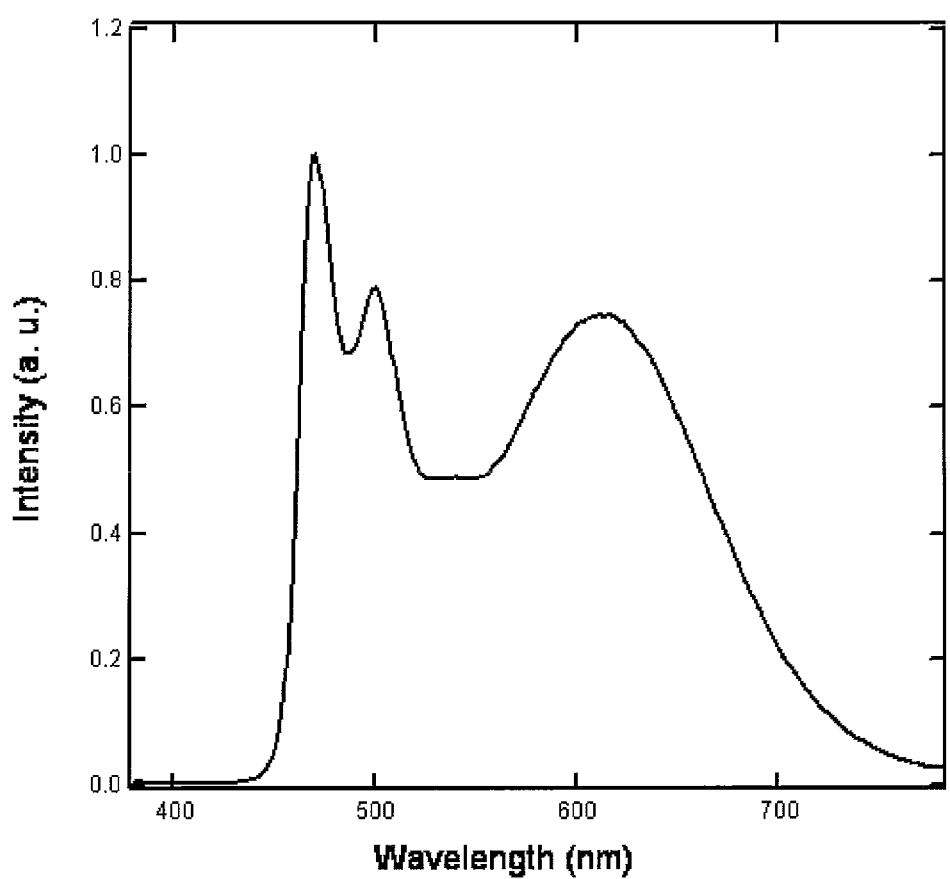
FIG. 12 is a diagram showing the emission spectrum of Example 7.
Figure 13:
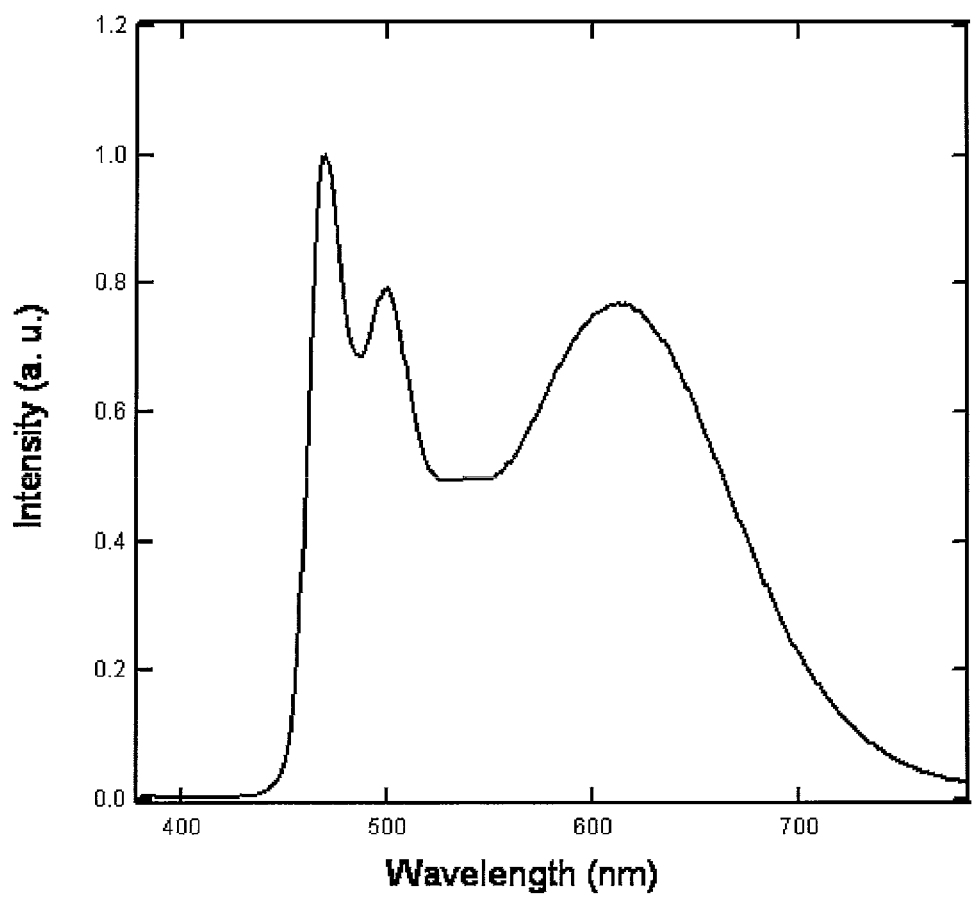
FIG. 13 is a diagram showing the emission spectrum of Comparative Example 7.

The prepared organic electric field light-emitting elements of Example 7 and Comparative Example 7 were evaluated in terms of integral spectrum intensity C of the monomer, integral spectrum intensity D of the association, external quantum efficiency, permanence (relative luminance half-life), CIEx, CIEy, and chromaticity change (ΔE) in the same manner as in Example 1 and Comparative Example 1. The results are shown in Tables 1-1 and 1-2. The emission spectrum of the element of Example 7 measured in the same manner as in Example 1 and Comparative to Example 1 is shown in FIG. 12, and that of Comparative Example 7 is shown in FIG. 13.

Example 8

An organic electric field light-emitting element of Example 8 was prepared in the same manner as in Example 1, provided that mCP doped with Compound 2 expressed by the structural formula above, where the amount of Compound 2 was continuously changed from 30% by mass (at Compound 1 side) to 50% by mass (at Balq side) was deposited by vacuum deposition to give a thickness of 60 nm to thereby form a light-emitting layer.

The layer structure of the organic electric field light-emitting element of Example 8 was as presented below. Note that, the values given in the brackets indicate the thickness of each layer.

<ITO (100 nm)/2-TNATA+1% by mass of F4-TCNQ (45 nm)/NPD (7 nm)/Compound 1 (3 nm)/mCP+XX % by mass of Compound 2 (60 nm)/Balq (39 nm)/BCP (1 nm)/LiF (0.5 nm)/Al (100 nm)>

Comparative Example 8

An organic electric field light-emitting element of Comparative Example 8 was prepared in the same manner as in Example 8, provided that mCP serving as a host material, doped with 40% by mass of Compound 2 relative to the amount of mCP was deposited by vacuum deposition to give a thickness of 60 nm to thereby form a light-emitting layer.

The layer structure of the organic electric field light-emitting element of Comparative Example 8 was as presented below. Note that, the values given in the brackets indicate the thickness of each layer.

<ITO (100 nm)/2-TNATA+1% by mass of F4-TCNQ (45 nm)/NPD (7 nm)/Compound 1 (3 nm)/mCP+40% by mass of Compound 2 (60 nm)/Balq (39 nm)/BCP (1 nm)/LiF (0.5 nm)/Al (100 nm)>

Figure 14:
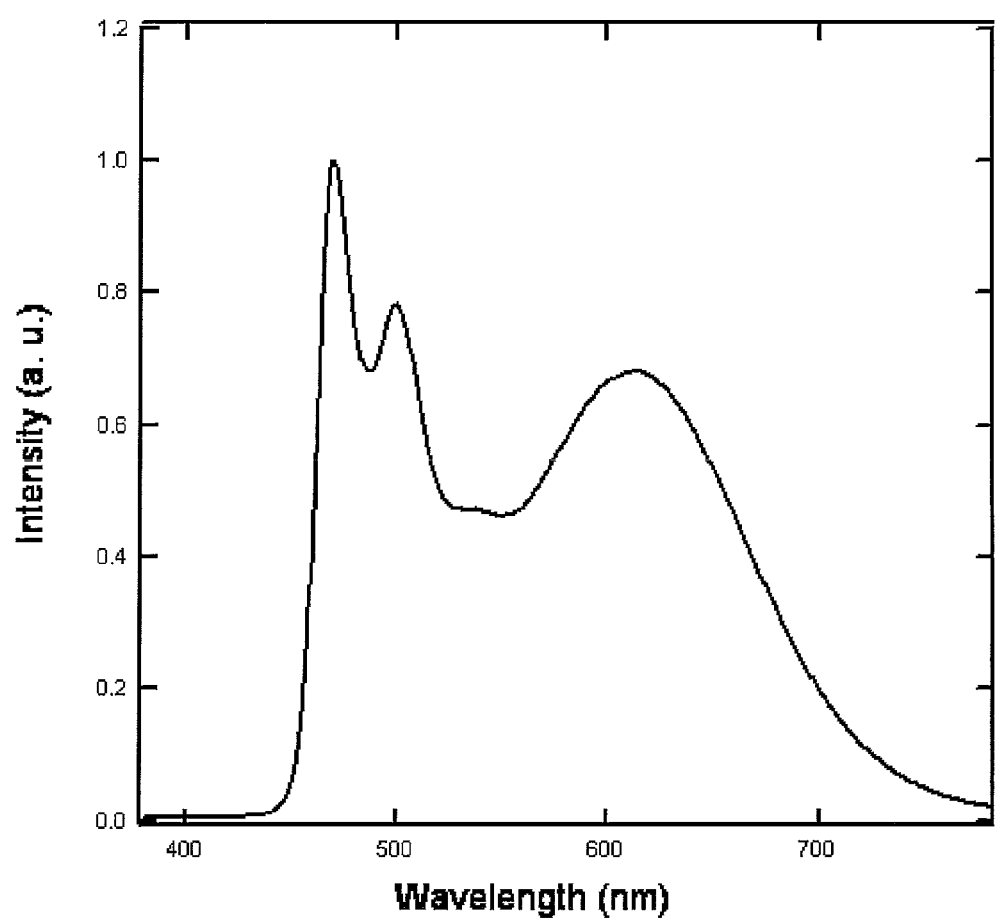
FIG. 14 is a diagram showing the emission spectrum of Example 8.
Figure 15:
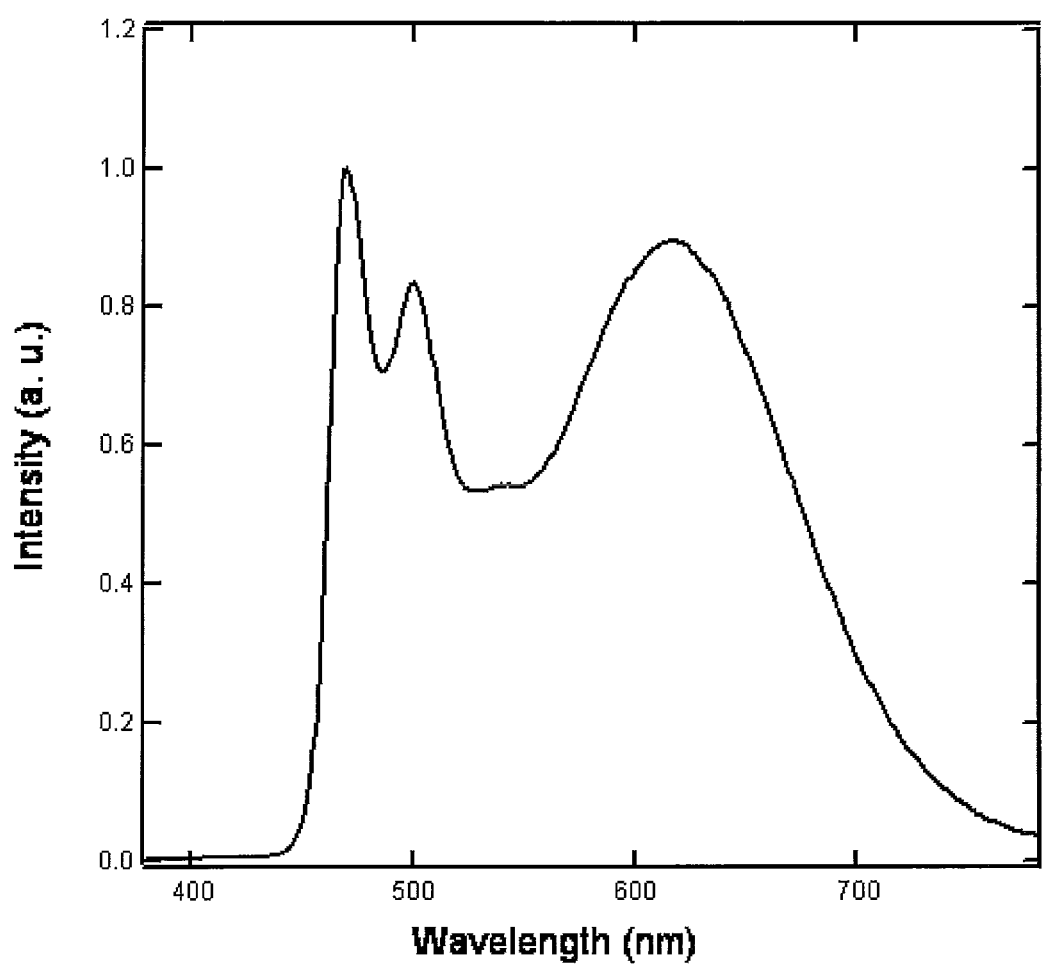
FIG. 15 is a diagram showing the emission spectrum of Comparative Example 8.

The prepared organic electric field light-emitting elements of Example 8 and Comparative Example 8 were evaluated in terms of integral spectrum intensity C of the monomer, integral spectrum intensity D of the association, external quantum efficiency, permanence (relative luminance half-life), CIEx, CIEy, and chromaticity change (ΔE) in the same manner as in Example 1 and Comparative Example 1. The results are shown in Tables 1-1 and 1-2. The emission spectrum of the element of Example 8 measured in the same manner as in Example 1 and Comparative Example 1 is shown in FIG. 14, and that of Comparative Example 8 is shown in FIG. 15.

Example 9

An organic electric field light-emitting element of Example 9 was prepared in the same manner as in Example 1, provided that mCP doped with Compound 2 expressed by the structural formula above where the amount of Compound 2 was continuously changed from 40% by mass (at Compound 1 side) to 50% by mass (at Balq side) was deposited by vacuum deposition to give a thickness of 15 nm to thereby form a light-emitting layer.

The layer structure of the organic electric field light-emitting element of Example 9 was as presented below. Note that, the values given in the brackets indicate the thickness of each layer.

<ITO (100 nm)/2-TNATA+1% by mass of F4-TCNQ (45 nm)/NPD (7 nm)/Compound 1 (3 nm)/mCP+XX % by mass of Compound 2 (15 nm)/Balq (39 nm)/BCP (1 nm)/LiF (0.5 nm)/Al (100 nm)>

Comparative Example 9

An organic electric field light-emitting element of Comparative Example 9 was prepared in the same manner as in Example 9, provided that mCP serving as a host material, doped with 40% by mass of Compound 2 expressed by the structural formula above, relative to the amount of mCP was deposited by vacuum deposition to give a thickness of 15 nm to thereby form a light-emitting layer.

The layer structure of the organic electric field light-emitting element of Comparative Example 9 was as presented below. Note that, the values given in the brackets indicate the thickness of each layer.

<ITO (100 nm)/2-TNATA+1% by mass of F4-TCNQ (45 nm)/NPD (7 nm)/Compound 1 (3 nm)/mCP+40% by mass of Compound 2 (15 nm)/Balq (39 nm)/BCP (1 nm)/LiF (0.5 nm)/Al (100 nm)>

Figure 16:
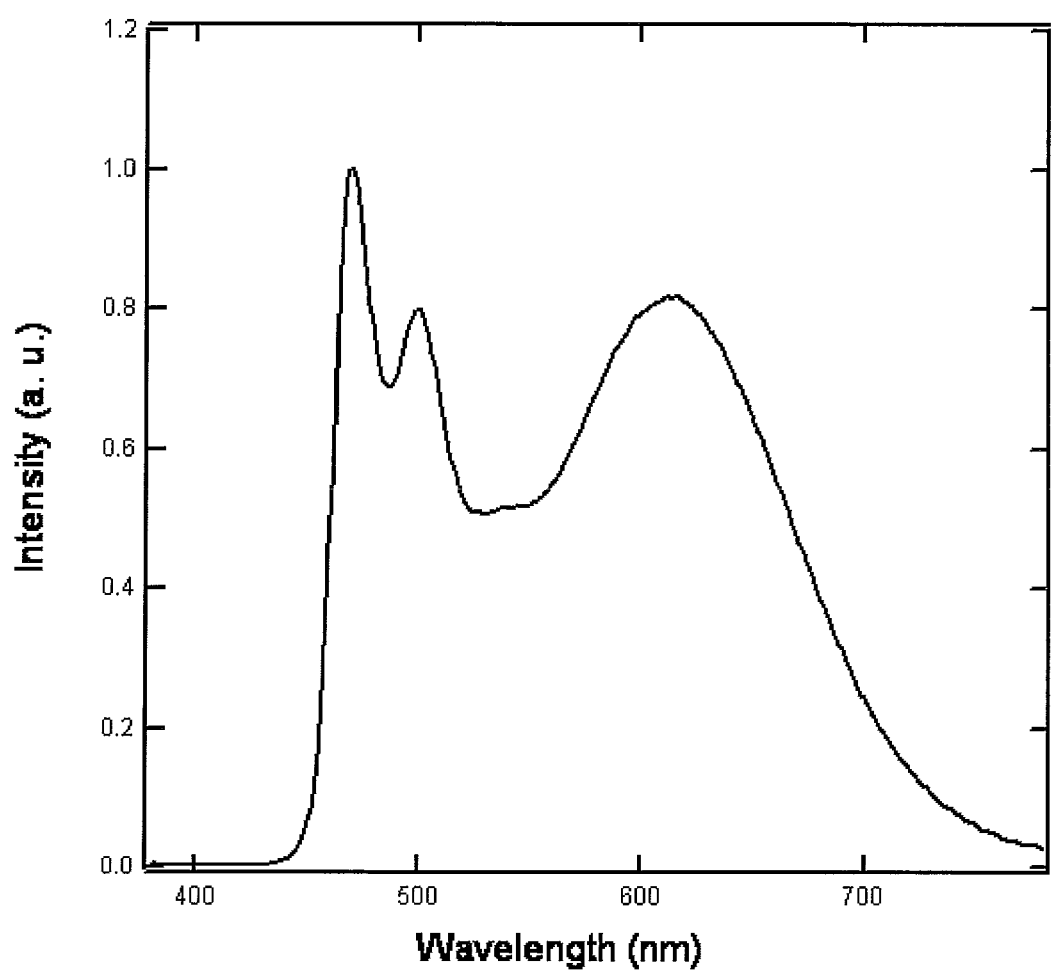
FIG. 16 is a diagram showing the emission spectrum of Example 9.
Figure 17:
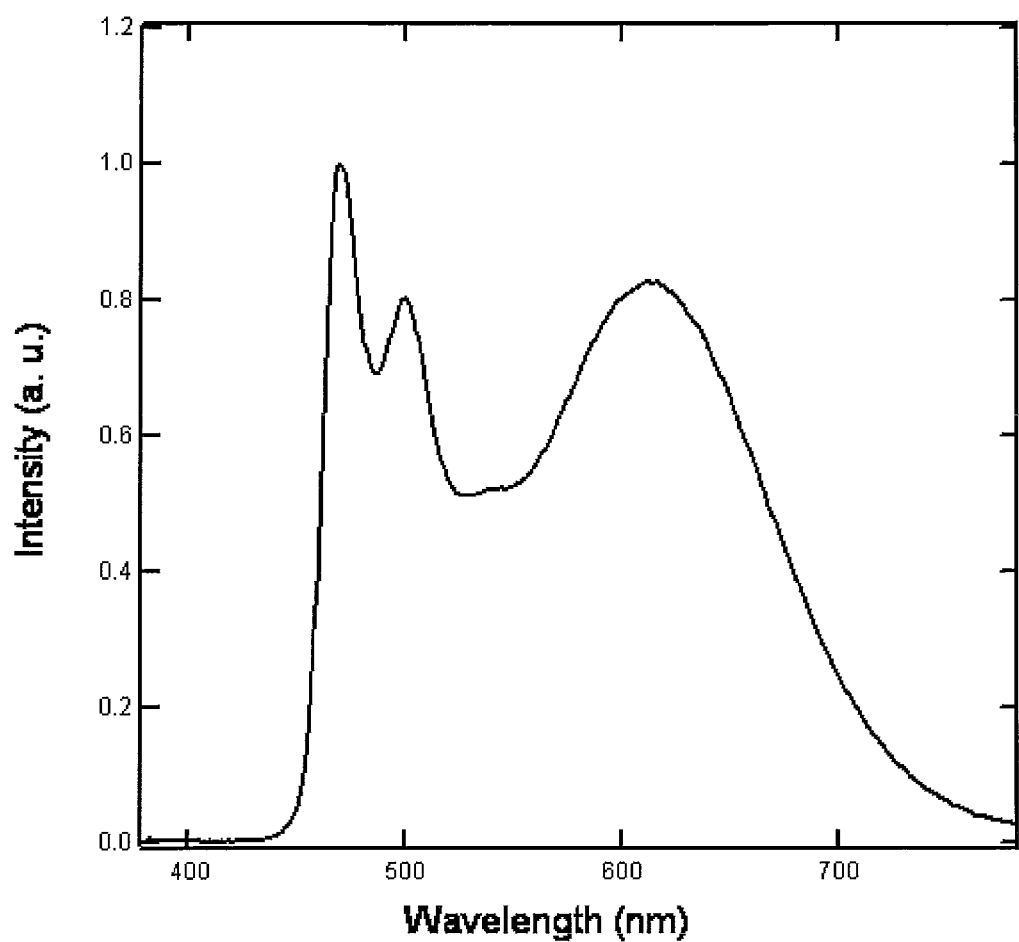
FIG. 17 is a diagram showing the emission spectrum of Comparative Example 9.

The prepared organic electric field light-emitting elements of Example 9 and Comparative Example 9 were evaluated in terms of integral spectrum intensity C of the monomer, integral spectrum intensity D of the association, external quantum efficiency, permanence (relative luminance half-life), CIEx, CIEy, and chromaticity change (ΔE) in the same manner as in Example 1 and Comparative Example 1. The results are shown in Tables 1-1 and 1-2. The emission spectrum of the element of Example 9 measured in the same manner as in Example 1 and Comparative Example 1 is shown in FIG. 16, and that of Comparative Example 9 is shown in FIG. 17.

TABLE 1-1

| | Concentration A | Concentration B | Concentration ratio (B/A) × 100 | Intensity C of monomer | Intensity D of association | Intensity ratio (D/C) × 100 |
|---|---|---|---|---|---|---|
| Ex. 1 | — | — | — | 63 | 103 | 163.5 |
| Comp. Ex. 1 | — | — | — | 61 | 104 | 170.5 |
| Ex. 2 | 15 | 0.13 | 0.9 | — | — | — |
| Comp. Ex. 2 | 15 | 0.13 | 0.9 | — | — | — |
| Ex. 3 | 15 | 0.13 | 0.9 | — | — | — |
| Comp. Ex. 3 | 15 | 0.13 | 0.9 | — | — | — |
| Ex. 4 | 10 | 0.1 | 1 | — | — | — |

TABLE 1-1-continued

|  | Concentration A | Concentration B | Concentration ratio (B/A)× 100 | Intensity C of monomer | Intensity D of association | Intensity ratio (D/C)× 100 |
|---|---|---|---|---|---|---|
| Comp. Ex. 4 | 10 | 0.1 | 1 | — | — | — |
| Ex. 5 | 10 | 0.1 | 1 | — | — | — |
| Comp. Ex. 5 | 10 | 0.1 | 1 | — | — | — |
| Ex. 6 | 10 | 0.1 | 1 | — | — | — |
| Comp. Ex. 6 | 10 | 0.1 | 1 | — | — | — |
| Ex. 7 | — | — | — | 62 | 92 | 148.4 |
| Comp. Ex. 7 | — | — | — | 60 | 95 | 158.3 |
| Ex. 8 | — | — | — | 61 | 84 | 137.7 |
| Comp. Ex. 8 | — | — | — | 63 | 88 | 139.7 |
| Ex. 9 | — | — | — | 63 | 101 | 160.3 |
| Comp. Ex. 9 | — | — | — | 62 | 105 | 169.4 |

Note that, the spectrum intensity is the value when the current is applied at 0.25 mA/cm$^2$, and the concentration is the concentration at the anode (transparent electrode) side of the light-emitting layer.

TABLE 1-2

|  | External quantum efficiency | Relative luminance half-life | CIE X (0.25 mA/cm$^2$) | CIE Y (0.25 mA/cm$^2$) | CIE X (25 mA/cm$^2$) | CIE Y (25 mA/cm$^2$) | Color difference ΔE |
|---|---|---|---|---|---|---|---|
| Ex. 1 | 13.10% | 1.3 | 0.390 | 0.397 | 0.388 | 0.395 | 0.056 |
| Comp. Ex. 1 | 12.97% | 1.0 | 0.394 | 0.399 | 0.3746 | 0.392 | 0.473 |
| Ex. 2 | 6.72% | 1.1 | 0.319 | 0.395 | 0.317 | 0.390 | 0.138 |
| Comp. Ex. 2 | 6.46% | 1.0 | 0.320 | 0.391 | 0.318 | 0.363 | 0.913 |
| Ex. 3 | 6.53% | 1.2 | 0.322 | 0.388 | 0.320 | 0.385 | 0.082 |
| Comp. Ex. 3 | 6.46% | 1.0 | 0.320 | 0.391 | 0.318 | 0.363 | 0.913 |
| Ex. 4 | 6.81% | 1.2 | 0.323 | 0.401 | 0.322 | 0.391 | 0.308 |
| Comp. Ex. 4 | 6.46% | 1.0 | 0.320 | 0.391 | 0.318 | 0.363 | 0.913 |
| Ex. 5 | 5.43% | 1.1 | 0.339 | 0.393 | 0.341 | 0.392 | 0.084 |
| Comp. Ex. 5 | 5.36% | 1.0 | 0.325 | 0.387 | 0.343 | 0.397 | 0.442 |
| Ex. 6 | 5.95% | 1.2 | 0.373 | 0.390 | 0.375 | 0.392 | 0.057 |
| Comp. Ex. 6 | 5.89% | 1.0 | 0.368 | 0.388 | 0.385 | 0.396 | 0.407 |
| Ex. 7 | 14.22% | 1.2 | 0.386 | 0.392 | 0.388 | 0.390 | 0.116 |
| Comp. Ex. 7 | 13.48% | 1.0 | 0.398 | 0.401 | 0.371 | 0.385 | 0.641 |
| Ex. 8 | 12.60% | 1.3 | 0.386 | 0.399 | 0.385 | 0.394 | 0.152 |
| Comp. Ex. 8 | 12.20% | 1.0 | 0.487 | 0.429 | 0.377 | 0.398 | 2.673 |
| Ex. 9 | 10.80% | 1.1 | 0.392 | 0.402 | 0.393 | 0.404 | 0.054 |
| Comp. Ex. 9 | 10.50% | 1.0 | 0.384 | 0.399 | 0.380 | 0.397 | 0.094 |

From the results shown in Tables 1-1 and 1-2, it was found that the organic electric field light-emitting elements of Examples 1 to 9 had smaller chromaticity change (ΔE) when the applied current was changed, compared to those of Comparative Example 1 to 9. Moreover, with the organic electric field light-emitting elements of Examples 1 to 9, the effects of improving emission efficiency and permanence were also recognized.

The organic electric field light-emitting element of the present invention is suitably used, for example, for display elements, displays, backlights, electrophotography, illumination light sources, recording light sources, exposure light sources, recording light sources, indicators, signboards, interior decorations, optical communications and the like.

What is claimed is:

1. An organic electric field light-emitting element, comprising:
    an anode;
    a cathode; and
    a light-emitting layer provided between the anode and the cathode,
    wherein the light-emitting layer contains two or more luminescent materials each giving a different emission peak, and a concentration ratio [(B/A)×100] in the light-emitting layer gradually increases along with the direction from an anode side of the light-emitting layer to a cathode side of the light-emitting layer, where the concentration ratio [(B/A)×100] is a concentration ratio of the luminescent materials, and A denotes a concentration of the luminescent material having the emission peak at the shortest wavelength side compared to the emission peaks of other luminescent materials, and B denote a concentration of the luminescent material having the emission peak at the longest wavelength side compared to the emission peaks of other luminescent materials, and
    wherein the light-emitting layer satisfies the relationship of: [(B/A)×100]≦10%.

2. The organic electric field light-emitting element according to claim 1, wherein B is constant and A decreases along with the direction from the anode side to the cathode side.

3. The organic electric field light-emitting element according to claim 1, wherein B increases along with the direction from the anode side to the cathode side, and A is constant.

4. The organic electric field light-emitting element according to claim 1, wherein B increases and A decreases along with the direction from the anode side to the cathode side.

5. The organic electric field light-emitting element according to claim 1, wherein the light-emitting layer satisfies the relationship of: a/b>1.05, where a denotes B/A at the cathode side of the light-emitting layer, and b denotes B/A at the anode side of the light-emitting layer.

6. The organic electric field light-emitting element according to claim 1, wherein the light-emitting layer has a thickness of 20 nm or more.

7. The organic electric field light-emitting element according to claim 1, wherein the cathode is a reflecting electrode, and the anode is a transparent is electrode.

8. The organic electric field light-emitting element according to claim 1, wherein the cathode is a reflecting electrode, and the anode is a translucent electrode.

9. The organic electric field light-emitting element according to claim 1, wherein the luminescent materials are phosphorescent materials.

10. An organic electric field light-emitting element, comprising:
    an anode;
    a cathode; and
    a light-emitting layer provided between the anode and the cathode,
    wherein the light-emitting layer contains a luminescent material whose monomer and association each give a different emission peak,
    wherein a ratio of a concentration of the association of the luminescent material to a concentration of the monomer of the luminescent material gradually increases along with the direction from an anode side of the light-emitting layer to a cathode side of the light-emitting layer, and wherein the light-emitting layer satisfies an intensity ratio [(D/C)×100] of 20% or larger, where C denotes an integral spectrum intensity of the monomer and D denotes an integral spectrum intensity of the association.

11. The organic electric field light-emitting element according to claim 10, wherein the concentration of the association is constant, and the concentration of the monomer decreases along with the direction from the anode side to the cathode side, where the emission peak of the association is present at longer wavelength side compared to the emission peak of the monomer, and the emission peak of the monomer is present at shorter wavelength side compared to the emission peak of the association.

12. The organic electric field light-emitting element according to claim 10, wherein the concentration of the association increases along with the direction from the anode side to the cathode side, and the concentration of the monomer is constant, where the emission peak of the association is present at longer wavelength side compared to the emission peak of the monomer, and the emission peak of the monomer is present at shorter wavelength side compared to the emission peak of the association.

13. The organic electric field light-emitting element according to claim 10, wherein the concentration of the association increases and the concentration of the monomer decreases along with the direction from the anode side to the cathode side, where the emission peak of the association is present at longer wavelength side compared to the emission peak of the monomer, and the emission peak of the monomer is present at shorter wavelength side compared to the emission peak of the association.

14. The organic electric field light-emitting element according to claim 10, wherein the light-emitting layer satisfies the relationship of: a/b>1.05, where a denotes the ratio of the concentration of the association to the concentration of the monomer at the cathode side of the light-emitting layer, and b denotes the ratio of the concentration of the association to the concentration of the monomer at the anode side of the light-emitting layer, and wherein the emission peak of the association is present at longer wavelength side compared to the emission peak of the monomer, and the emission peak of the monomer is present at shorter wavelength side compared to the emission peak of the association.

15. The organic electric field light-emitting element according to claim 10, wherein the light-emitting layer has a thickness of 20 nm or more.

16. The organic electric field light-emitting element according to claim 10, wherein the cathode is a reflecting electrode, and the anode is a transparent electrode.

17. The organic electric field light-emitting element according to claim 10, wherein the cathode is a reflecting electrode, and the anode is a translucent electrode.

18. The organic electric field light-emitting element according to claim 10, wherein the luminescent material is a phosphorescent material.

* * * * *